(12) United States Patent
Takeda et al.

(10) Patent No.: US 7,977,140 B2
(45) Date of Patent: Jul. 12, 2011

(54) METHODS FOR PRODUCING SOLID-STATE IMAGING DEVICE AND ELECTRONIC DEVICE

(75) Inventors: Takeshi Takeda, Kanagawa (JP); Yukihiro Ando, Kanagawa (JP); Masaki Okamoto, Kanagawa (JP); Masayuki Okada, Kanagawa (JP); Kaori Takimoto, Kanagawa (JP); Katsuhisa Kugimiya, Kanagawa (JP); Tadayuki Kimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 130 days.

(21) Appl. No.: 12/382,713

(22) Filed: Mar. 23, 2009

(65) Prior Publication Data

US 2009/0263929 A1   Oct. 22, 2009

(30) Foreign Application Priority Data

Apr. 21, 2008   (JP) ................ P2008-110670

(51) Int. Cl.
*H01L 21/00*   (2006.01)
(52) U.S. Cl. .......................................... 438/59
(58) Field of Classification Search .................. None
See application file for complete search history.

(56) References Cited

U.S. PATENT DOCUMENTS

| 5,360,744 | A  | * | 11/1994 | Shimizu et al. ............... 438/59 |
| 2006/0151818 | A1 | * | 7/2006 | Toumiya ......................... 257/294 |
| 2009/0149023 | A1 | * | 6/2009 | Koyanagi ........................ 438/666 |

FOREIGN PATENT DOCUMENTS

| JP | 09-148554 A | 6/1997 |
| JP | 2002-076320 A | 3/2002 |
| JP | 2006-041369 | 2/2006 |

OTHER PUBLICATIONS

Japanese Office Action issued Apr. 20, 2010 for corresponding Japanese Application No. 2008-110670.

* cited by examiner

*Primary Examiner* — Charles D Garber
*Assistant Examiner* — Andre' C Stevenson
(74) *Attorney, Agent, or Firm* — Rader, Fishman & Grauer PLLC

(57) ABSTRACT

A method for producing a solid-state imaging device includes steps of: forming transfer electrodes on a substrate having a plurality of light-sensing portions through a gate insulating layer so that the light-sensing portions are exposed; forming a planarized insulating layer on the substrate to cover the transfer electrodes formed on the substrate; forming openings in the planarized insulating layer so that each of the transfer electrodes is partly exposed out of the planarized insulating layer at a predetermined position; forming a wiring material layer so that the openings are filled with the wiring material layer; forming a resist layer on the wiring material layer; exposing and developing the resist layer so that only the resist layer in a predetermined area covering the openings is left; and patterning the wiring material layer using the exposed and developed resist layer to form connection wirings connected to the transfer electrodes by the openings.

10 Claims, 19 Drawing Sheets b—b b—b

METHODS FOR PRODUCING SOLID-STATE IMAGING DEVICE AND ELECTRONIC DEVICE

BACKGROUND OF THE INVENTION

1. Field of the Invention

The present invention relates to a method for producing a solid-state imaging device, particularly to a method for producing a CCD (Charge Coupled Device) type solid-state imaging device, and a method for producing an electronic device using the solid-state imaging device.

2. Description of the Related Art

A CCD type solid-state imaging device used in an area sensor, a digital still camera or the like has a plurality of charge-transfer electrodes for transferring signal charges from a light-sensing portion. The plurality of charge-transfer electrodes are disposed adjacent to each other on a charge transfer path formed in a semiconductor substrate and sequentially driven.

In order to obtain a solid-state imaging device having a large screen and to transfer charges at high speed, the charge-transfer electrodes are required to have low resistance. Further, in order to make the light simultaneously incident on the light-sensing portion efficiently, it is preferred that the height of the charge-transfer electrodes is as low as possible and the wiring width of the charge-transfer electrodes is as small as possible. The lower the height of the charge-transfer electrodes is, the more amount of light incident at wide angles enters the light-sensing portion without being eclipsed by the charge-transfer electrodes. Further, the smaller the wiring width of the charge-transfer electrodes is, the more widely the opening of the light-sensing portion can be formed, and therefore the more light can be taken into the light-sensing portion.

In order to reduce the eclipse of the incident light caused by the wiring as much as possible so that more amount of light is incident on the light-sensing portion, it is proposed in Japanese Unexamined Patent Application Publication No. 2006-41369 that connection wirings made of a material having low resistance are used as wirings between the charge-transfer electrodes.

A solid-state imaging device and a producing method thereof according to a related art will be described below with reference to FIGS. 19 to 22G.

FIG. 19 shows a plane configuration of a primary portion of a pixel region of a solid-state imaging device 101 according to the related art. As shown in FIG. 19, in the solid-state imaging device 101 according to the related art, a plurality of light-sensing portions 104 each composed of a photodiode are arranged in a horizontal direction and a vertical direction. Further, transfer channels 102 extending in the horizontal direction are arranged adjacent to the light-sensing portions 104 in the horizontal direction. The transfer channels 102 each extend between the light-sensing portions 104 arranged in the horizontal direction. The transfer channels 102 generate a potential distribution for transferring signal charges in the vertical direction.

Transfer electrodes 103 are arranged on the transfer channels 102 extending in the vertical direction. Each of the transfer electrodes 103 is divided into a first transfer electrode 103a and a second transfer electrode 103b in the view of a layout shape. A single layer transfer electrode structure is adopted by the related art wherein the first transfer electrodes 103a and the second transfer electrodes 103b are formed in the same layer. The transfer electrodes 103 are formed of polysilicon, for example.

Further, the first transfer electrodes 103a and the second transfer electrodes 103b are alternately and repeatedly arranged on the transfer channels 102 in the vertical direction. A vertical transfer section configured by the transfer electrodes 103 and the transfer channel 102 is arranged in common for each line of the light-sensing portions 104 arranged in the vertical direction.

Further, the second transfer electrodes 103b are each formed in a floating island shape on the transfer channel 102, that is, the second transfer electrodes 103b are separated and not connected to each other in the horizontal direction. The second transfer electrodes 103b are arranged adjacent to the light-sensing portions 104. Further, the first transfer electrodes 103a and the second transfer electrodes 103b have contact portions 116 formed thereon, the contact portions 116 being connected to the connection wirings 106 formed on an upper layer.

Two connection wirings 106 extending in the horizontal direction are arranged on each of the first transfer electrodes 103a through an insulating layer. The two connection wirings 106 serve as shunt wirings, and are divided into a connection wiring 106a and a connection wiring 106b depending on different destinations to be connected. For example, the connection wiring 106a is connected to the first transfer electrode 103a on the transfer channel 102 by the contact portion 116 formed in an opening 112. The connection wiring 106b is connected to the second transfer electrode 103b on the transfer channel 102 by the contact portion 116.

In the solid-state imaging device 101 having the aforesaid configuration, the first transfer electrodes 103a and the second transfer electrodes 103b alternately and repeatedly arranged on the transfer channels 102 in the vertical direction are supplied with transfer pulses of four phases having different phases φV1, φV2, φV3 and φV4 along the vertical direction through the connection wirings 106. The voltage of the transfer pulses φV1 to φV4 are, for example, −7V to 0V. Further, in addition to the transfer pulses φV1 and φV3, the floating island shaped second transfer electrodes 103b adjacent to the light-sensing portions 104 are supplied with a read pulse φR for transferring the signal charges accumulated in the light-sensing portions 104 to the transfer channels 102 through the connection wirings 106b. The voltage of the read pulse φR is, for example, +12V to +15V.

A method for producing the solid-state imaging device 101 according to the related art will be described below with reference to FIGS. 20A to 20D and FIGS. 21E to 21G. The cross section shown in FIGS. 20A to 20D and FIGS. 21E to 21G is taken along line a-a of FIG. 19.

First, as shown in FIG. 20A, the transfer electrodes 103 formed of polysilicon are formed on a semiconductor substrate 107 through a gate insulating layer 108 by a thermal oxidation method or a CVD (chemical vapor deposition) method, the semiconductor substrate 107 having the transfer channels 102 formed therein. Further, a silicon nitride layer 110 and a silicon oxide layer 111, for example, are formed by a CVD method to cover the transfer electrodes 103. Next, the silicon nitride layer 110 and the silicon oxide layer 111 in the area corresponding to connecting portions is removed to expose a part of the transfer electrodes 103 on the transfer channels 102, so that the opening 112 is formed.

Next, as shown in FIG. 20B, a barrier metal layer 118 composed of a titanium layer and a titanium nitride layer is formed by a sputtering method or a CVD method, and thereafter a tungsten layer 113 is formed. The tungsten layer 113 is used to form the connection wirings 106 in a step described later. At this time, since the tungsten layer 113 is formed following the shape of the transfer electrodes 103 formed of polysilicon, there are stepped portions on the surface of the tungsten layer 113.

Next, as shown in FIG. 20C, a resist layer 114 for forming the connection wirings 106 is coated on the surface of the tungsten layer 113. Thereafter, as shown in FIG. 20D, the resist layer 114 is exposed and developed, and thereby only the portions thereof corresponding to the connection wirings 106 are left. At this time, however, due to the stepped portions of the tungsten layer 113, the thickness of the resist layer 114 formed on the tungsten layer 113 is uneven. As a result, when the resist layer 114 is exposed, since non-uniform light is reflected from the stepped portions of the underlying tungsten layer 113, the wiring widths Wa, Wb of the developed resist layer 114 are uneven even if the same exposure amount is applied.

As shown in FIG. 21E, the connection wirings 106 are formed using the resist layer 114 as a mask. However, since the pattern is formed using the resist layer 114 having uneven wiring widths Wa, Wb, the wiring widths Wc, Wd of the connection wirings 106 are also uneven.

Further, in the producing process according to the related art, due to the stepped portions formed on the side wall of the transfer electrodes 103, a wiring material layer composed of the barrier metal layer 118 and the tungsten layer 113 of this part is thicker than that of the other part. Thus, as shown in FIG. 21E, when forming the connection wirings 106 by etching the barrier metal layer 118 and the tungsten layer 113, remaining layers 118a are left in the side wall portions of the connection wirings 106. If performing an overetching process to remove the remaining layers 118a, the exposed silicon oxide layer 111 will decrease, and therefore there is a concern that the semiconductor substrate 107 will be exposed.

Further, in the solid-state imaging device 101 according to the related art, two connection wirings 106a, 106b connected to the first transfer electrode 103a and the second transfer electrode 103b are configured on the second transfer electrode 103b. FIG. 22 shows a structure of the cross section taken along line b-b of the solid-state imaging device of FIG. 19. In the case where the two connection wirings 106a, 106b are configured on the second transfer electrode 103b, each of the connection wirings 106a, 106b needs to be formed relatively thin. Accordingly, if thickness of the resist layer 114 is uneven due to the stepped portions, there is a concern that the wiring width of the connection wirings 106, which have small wiring width in design, will become further smaller, and the distance between adjacent connection wirings 106 will become too small. As a result, as shown in FIG. 22, the layer forming the connection wirings 106 may be left unetched for example, and which may cause a short-circuit.

Further, after the step shown in FIG. 21E, an insulating layer 117 formed of silicon oxide is formed as shown in FIG. 21F. Further, as shown in FIG. 21G, a light shielding layer 119 is formed, and the light shielding layer 119 and the insulating layer 117 in the area corresponding to the light-sensing portions 104 is removed.

In the solid-state imaging device 101 formed in such a manner, since the wiring width of the connection wirings 106 is uneven, the width of the opening of the light shielding layer 119 and the width of the light incident path will be uneven. As a result, the amount of the light incident on the light-sensing portions 104 will be uneven, which can be recognized as unevenness of sensitivity and smear quantity in the picture.

SUMMARY OF THE INVENTION

In view of the aforesaid problems, it is desired to provide a method for producing a highly reliable solid-state imaging device which has excellent smear characteristic, excellent white blemish characteristic and excellent dark current characteristic, and in which thin connection wirings can be configured on the transfer electrodes.

A method for producing a solid-state imaging device according to an embodiment of the present invention includes the following steps. The method includes a step of forming transfer electrodes on a substrate having a plurality of light-sensing portions through a gate insulating layer so that the light-sensing portions are exposed. The method further includes a step of forming a planarized insulating layer on the substrate to cover the transfer electrodes formed on the substrate. The method further includes a step of forming openings in the planarized insulating layer so that each of the transfer electrodes has a part thereof exposed out of the planarized insulating layer at a predetermined position. The method further includes a step of forming a wiring material layer so that the openings are filled with the wiring material layer. The method further includes a step of forming a resist layer on the wiring material layer. The method further includes a step of exposing and developing the resist layer so that only the resist layer in a predetermined area covering the openings is left. The method further includes a step of patterning the wiring material layer using the exposed and developed resist layer to form connection wirings which are connected to the transfer electrodes by the openings.

The openings are filled with wiring material layer so as to form contact portions for connecting the connection wirings with the transfer electrodes.

Further, in the method for producing a solid-state imaging device according to the embodiment of the present invention, the insulating layer formed to cover the transfer electrodes is planarized without being affected by stepped portions of the transfer electrodes. Thus, the openings formed in the next step can be precisely formed. Further, since the insulating layer is planarized without being affected by the stepped portions of the transfer electrodes, the wiring material layer can also be precisely patterned, and therefore desired connection wirings can be precisely formed. Furthermore, unevenness of the opening area of the light-sensing portions can be reduced.

With the method for producing a solid-state imaging device according to the embodiment of the present invention, since it is possible to precisely form the openings and connection wirings, it becomes possible to form thin connection wirings and to reduce unevenness in size of the openings. Thus, it is possible to provide a highly reliable solid-state imaging device which has excellent smear characteristic, excellent white blemish characteristic and excellent dark current characteristic.

DESCRIPTION OF THE PREFERRED EMBODIMENT(S)

Preferred embodiments of the present invention will be described below with reference to the attached drawings.

Figure 1A:
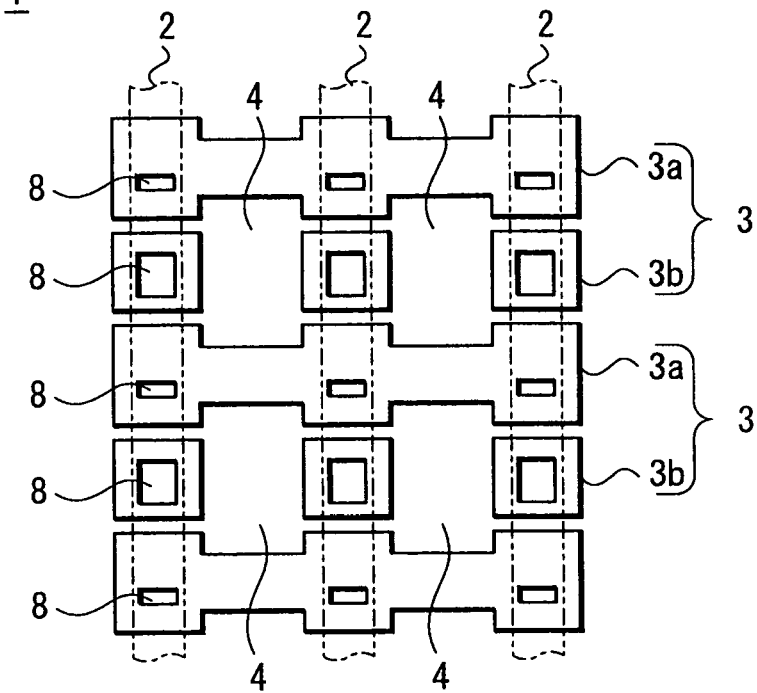
FIG. 1A is a view showing transfer electrodes of a solid-state imaging device formed by a method for producing the solid-state imaging device according to a first embodiment of the present invention.
Figure 1B:
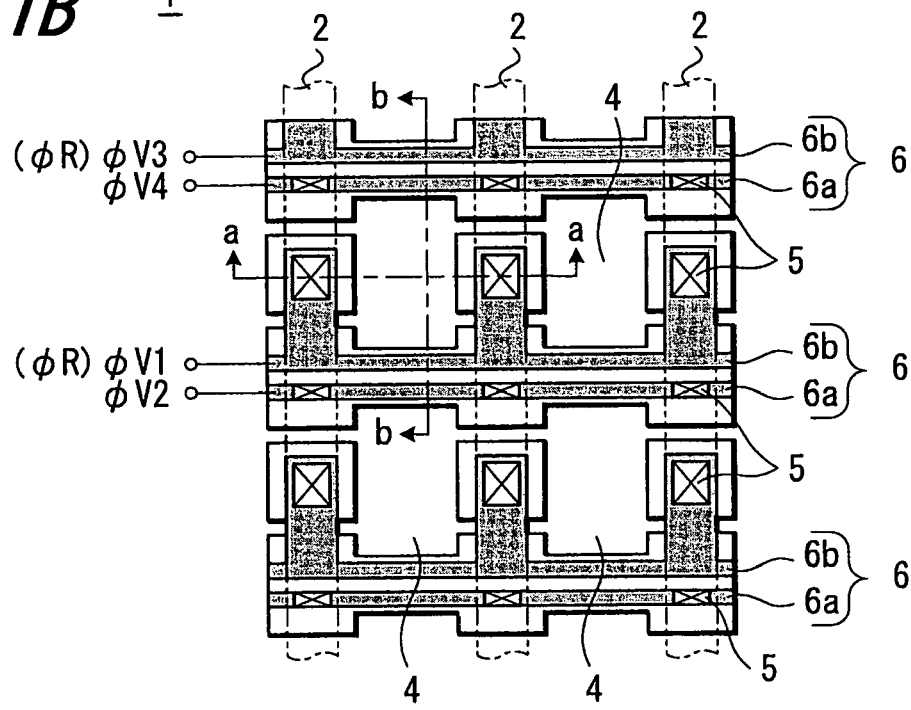
FIG. 1B is a view showing the transfer electrodes and connection wirings of the solid-state imaging device.

FIGS. 1A and 1B show a plane configuration of a primary portion of a solid-state imaging device formed by a method for producing a solid-state imaging device (a CCD type solid-state imaging device) 1 according to a first embodiment of the present invention. FIG. 1A shows single-layer transfer electrodes 3 formed of polysilicon, and FIG. 1B shows the single-layer transfer electrodes 3 and connection wirings 6 connected to the transfer electrodes 3 by contact portions 5 through an insulating layer.

As shown in FIG. 1A, in the solid-state imaging device 1 according to the present embodiment, a plurality of light-sensing portions 4 each composed of a photodiode are arranged in a semiconductor substrate (not shown) in a horizontal direction and a vertical direction. Further, transfer channels 2 extending in the horizontal direction are formed in the semiconductor substrate, the transfer channels 2 being arranged adjacent to the light-sensing portions 4 in the horizontal direction. The transfer channels 2 each extend between the light-sensing portions 4 arranged in the horizontal direction and generate a potential distribution for transferring signal charges in the vertical direction.

The transfer electrodes 3 are disposed, through the insulating layer, on the semiconductor substrate in which the transfer channels 2 extending in the vertical direction are formed. Each of the transfer electrodes 3 is divided into a first transfer electrode 3a and a second transfer electrode b in the view of a layout shape. In the present embodiment, a single layer transfer electrode structure is adopted in which the first transfer electrodes 3a and the second transfer electrodes 3b are formed in the same layer. When the transfer electrodes 3 are referred to in the description below, it should be understood that the transfer electrodes 3 include the first transfer electrode 3a and the second transfer electrode 3b.

Further, the first transfer electrodes 3a and the second transfer electrodes 3b are alternately and repeatedly arranged on the transfer channels 2 in the vertical direction. A vertical transfer section (not shown) configured by the transfer electrodes 3 and the transfer channel 2 is provided in common for each line of the light-sensing portions 4 arranged in the vertical direction.

Further, the second transfer electrodes 3b are each formed in a floating island shape on the transfer channel 2, that is, the second transfer electrodes 3b are separated and not connected to each other in the horizontal direction. The second transfer electrodes 3b are arranged adjacent to the light-sensing portions 4. Further, the first transfer electrodes 3a and the second transfer electrodes 3b have openings 8 formed therein, the openings 8 being provided to form contact portions 5 for connecting the first transfer electrodes 3a and the second transfer electrodes 3b with the connection wirings 6 formed on the transfer electrodes.

As shown in FIG. 1B, two connection wirings 6 extending in the horizontal direction are arranged on each of the first transfer electrodes 3a through an insulating layer. In the present embodiment, the two connection wirings 106 serve as shunt wirings, and are formed of a material having low resistance. The connection wirings 6 are divided into a connection wiring 6a and a connection wiring 6b depending on different destinations to be connected. For example, the connection wiring 6a is connected to the first transfer electrode 3a on the transfer channel 2 by the contact portion 5 formed in the opening 8. The connection wiring 6b is connected to the second transfer electrode 3b on the transfer channel 2 by the contact portion 5 formed at the opening 8.

In the solid-state imaging device 1 having the aforesaid configuration, the first transfer electrodes 3a and the second transfer electrodes 3b alternately and repeatedly arranged on the transfer channels 2 in the vertical direction are supplied with transfer pulses of four phases having different phases φV1, φV2, φV3 and φV4 along the vertical direction through the connection wirings 6. The voltage of the transfer pulses φV1 to φV4 are, for example, −7V to 0V. Further, in addition to the transfer pulses φV1 and φV3, the floating island shaped second transfer electrodes 3b adjacent to the light-sensing portions 4 are supplied with a read pulse φR for transferring the signal charges accumulated in the light-sensing portions 4 to the transfer channels 2 through the connection wirings 6b. The voltage of the read pulse φR is, for example, +12V to +15V.

In the solid-state imaging device 1 having the aforesaid configuration, when light is incident on the light-sensing portions 4, the signal charges are generated by photoelectric conversion according to the amount of the incident light, and the generated signal charges are accumulated in the semiconductor substrate for a predetermined period. Further, when the read pulses are supplied to the second transfer electrodes 3b through the connection wirings 6b which serve as the shunt wirings, the potential distribution in a read gate (not shown) changes, and the accumulated signal charges are read out to the transfer channels 2.

After the signal charges are read out to the transfer channels 2, the transfer pulses of four phases φV1, φV2, φV3 and φV4 are supplied to the transfer electrodes 3 arranged in the vertical direction through the connection wirings 6. The potential distribution of the transfer channels 2 is controlled by the transfer pulses of four phases φV1, φV2, φV3 and φV4, and the signal charges are transferred along the vertical direction.

Although not shown in the drawings, in the solid-state imaging device 1, after being transferred along the vertical direction, the signal charges are transferred along the horizontal direction by a horizontal transfer section, and converted into a voltage according to the amount of the signal charges, and outputted by an output section.

A method for producing the solid-state imaging device 1 shown in FIG. 1B according to the present embodiment will be described below with reference to FIGS. 2A to 6N. The cross section shown in FIGS. 2A to 6N is taken along line a-a of FIG. 1B.

Figure 2A:
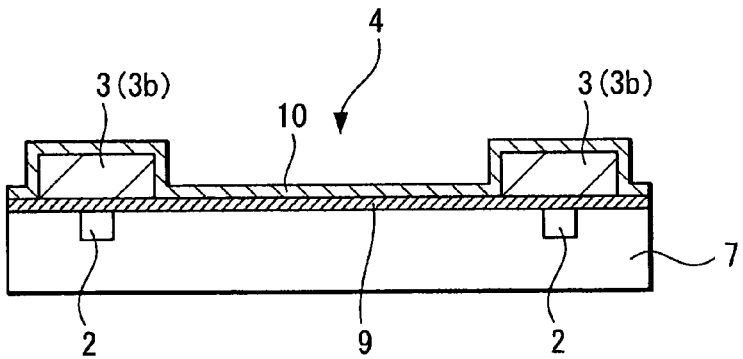
FIGS. 2A, 2B, 2C and 2D are views schematically showing steps (part 1) of a method for producing the solid-state imaging device according to the first embodiment of the present invention.

First, as shown in FIG. 2A, transfer electrodes 3 are formed, through a gate insulating layer 9, on the surface of a semiconductor substrate 7 in the positions where the transfer channels 2 are formed. Since FIG. 2A is taken along line a-a of FIG. 1B, it shows a structure of a cross section of the second transfer electrode 3b. The transfer electrodes are formed of polysilicon and have a thickness of about 200 to 300 nm, for example. The transfer electrodes 3 are formed by, for example, forming a polysilicon film on the entire surface and then removing the formed polysilicon film excluding the transfer electrodes 3. The plan view of the transfer electrodes 3 formed in such a manner is shown in FIG. 1A. Note that, although the structure of a cross section of the second transfer electrode 3b is explained with reference to FIG. 2A, since the transfer electrodes 3 have a single layer electrode structure as mentioned above, the first transfer electrodes 3a are also formed in the same layer and in the same step as the second transfer electrode 3b.

Further, after the transfer electrodes 3 are formed, a silicon nitride layer 10 is formed, which serves as a stopper for removing a silicon oxide layer in a step described later. The silicon nitride layer 10 is an "other insulating layer" formed of an insulating material other than silicon oxide. The silicon nitride layer 10 has a thickness of about 30 nm to 70 nm, and is formed by a CVD method. The silicon nitride layer 10 also serves as an antireflection layer for increasing the amount of light incident on the semiconductor substrate 7. For this reason, the "other insulating layer" does not have to be formed of silicon nitride but may also be formed of other material as long as such a material has a high refractive index, and etching selectivity to the insulating layer used for burying the light-sensing portions 4 in a step described later can be ensured. Examples of the material possible to be used as the "other insulating layer" include $AlO_2$ and the like. The refractive index of the material to be used as the "other insulating layer" is preferably as high as possible. However, in order to achieve the effect as an antireflection layer, it is preferred that the refractive index of the material used as the "other insulating layer" 20% higher than that of silicon oxide ($SiO_2$) whose refractive index is 1.45, that is, it is preferred that the refractive index of the material used as the "other insulating layer" is 1.8 or higher.

Figure 2B:
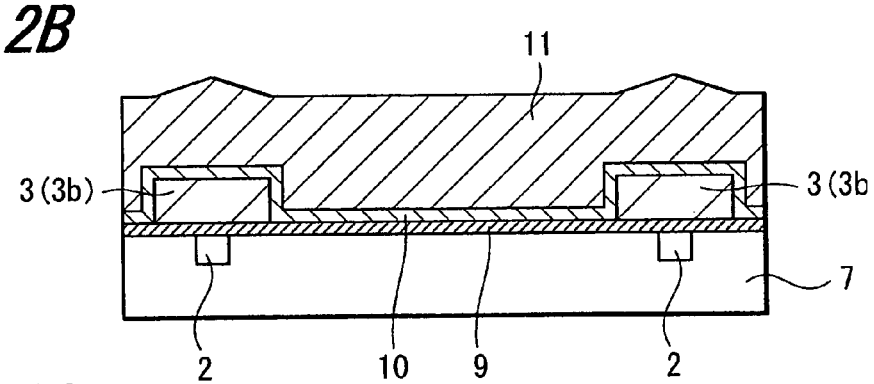

Next, as shown in FIG. 2B, an insulating layer 11 formed of, for example, silicon oxide is formed so that the transfer electrodes 3 on the semiconductor substrate 7 are covered by the insulating layer 11, so that the area where the polysilicon has been removed in the previous step is buried with the insulating layer 11. At this time, since being affected by the indentation of the underlying transfer electrodes 3, the buried insulating layer 11 has stepped portions formed on the surface thereof.

Figure 2C:
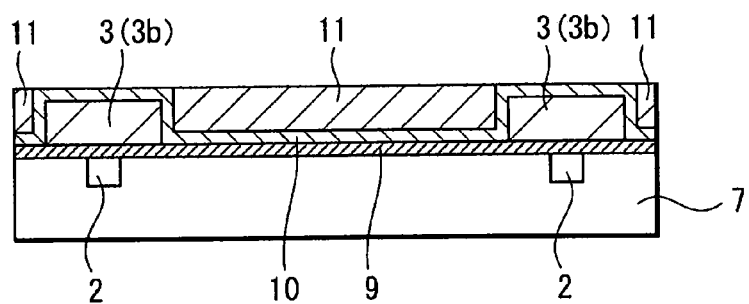

To eliminate the stepped portions, as shown in FIG. 2C, the surface of the insulating layer 11 is polished using a CMP (chemical mechanical polishing) method to planarize insulating layer 11. Since the underlying silicon nitride layer 10 serves as a stopper, the step of planarizing the insulating layer 11 by the CMP method is performed until the silicon nitride layer 10 above the transfer electrodes 3 is exposed. Note that, although an example in which silicon oxide is used as the material of the buried insulating layer 11 is explained with reference to FIG. 2B in the present embodiment, other material than silicon oxide may also be used as the insulating layer 11 as long as etching selectivity to the silicon nitride layer 10 can be ensured in the step of removing the insulating layer later. Examples of such a material include, for example, PSG (phosphosilicate glass), BPSG (borophosphsilicate glass) and the like. Further, in the case where material such as PSG, BPSG is used as the material of the buried insulating layer 11, since planarizing can be achieved by performing a heat treatment at a high temperature of 800° C. or so, the CMP method is unnecessary.

Figure 2D:
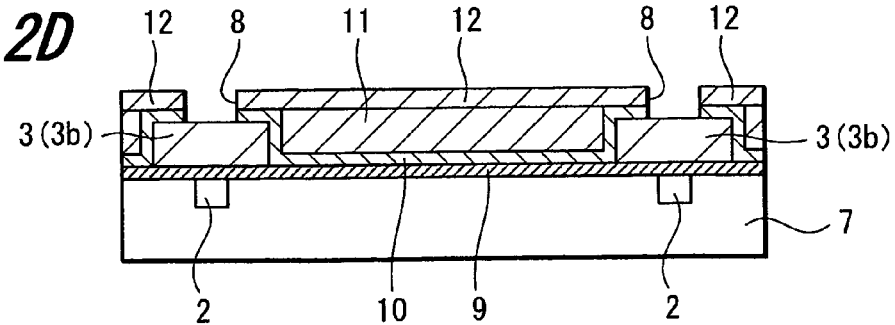

Thereafter, as shown in FIG. 2D, a thin insulating layer 12 formed of silicon oxide is formed on the entire surface again to cover the exposed silicon nitride layer 10, and then the openings 8 are formed, in which the contact portions 5 for connecting the transfer electrodes 3 with the connection wirings 6 are formed. The openings 8 are formed by forming a pattern using a lithography method, and then removing a part of the silicon nitride layer 10 and the insulating layer 12 in predetermined area above the transfer electrodes 3 using a dry etching method so as to expose the portions where the transfer electrodes 3 are connected with the connection wirings 6.

When forming the openings 8, since the surface of the insulating layer 11 has been planarized in the step shown in FIG. 2C, the pattern for forming the openings 8 is formed in a state where no stepped portion is formed on the surface. Thus, when performing the lithography method for forming the openings 8, since no unevenness in thickness and shape of the resist layer formed on the insulating layer 12, the openings 8 can be precisely formed. Thus, constant size of the openings 8 in plan view can be ensured, so that the openings 8 can be prevented from being formed too small. By performing the above steps, it is made sure that when forming the contact portions 5 by burying the wiring material layer into the openings 8 in a step described later, neither poor connection to the connection wirings 6 nor decrease in yield will be caused to the contact portion 5. Thus, reliability of the connection between the transfer electrodes 3 and the connection wirings 6 can be improved.

Figure 3E:
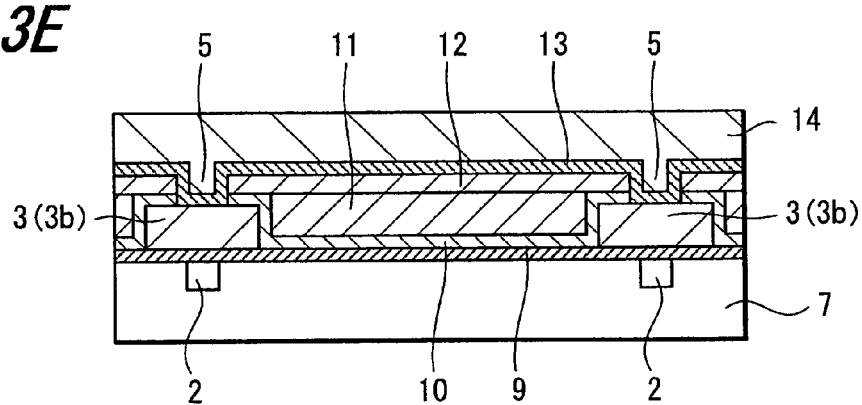
FIGS. 3E, 3F and 3G are views schematically showing steps (part 2) of the method for producing the solid-state imaging device according to the first embodiment of the present invention.

Next, as shown in FIG. 3E, a wiring material layer 14 is formed so that the openings 8 are buried with the wiring material layer 14. In the present embodiment, a barrier metal layer 13 formed of a titanium (Ti) layer and a titanium nitride (TiN) layer is formed first, and thereafter the wiring material layer 14 formed of tungsten (W) is formed on the barrier metal layer 13. The contact portions 5 are formed by burying the openings 8 with the wiring material layer 14. The wiring material layer 14 is used to form the connection wirings 6 in a step described later. The barrier metal layer 13 formed of a titanium layer and a titanium nitride layer is formed between the connection wirings 6 formed of tungsten and the transfer electrodes 3 formed of polysilicon, and thereby even performing the heat treatment at a high temperature of 800° C. or higher in a step described later, the reaction between the polysilicon forming the transfer electrodes 3 and the connection wirings 6 can be restrained by the barrier metal layer 13. Thus, a stable contact resistance can be obtained. Further, since the stable contact resistance can be obtained, not only there is merit in obtaining a stable low wiring resistance, but also it becomes possible to obtain a highly reliable wiring structure.

Note that, although the present embodiment is described using an example in which tungsten is used as the material of the wiring material layer 14, the present invention is not limited thereto. For example, the wiring material layer 14 may also be formed of other materials such as aluminum (Al), titan (Ti), copper (Cu), tantalum (Ta) and cobalt (Co), or their nitrides, silicides, or a laminated structure of these.

Figure 3F:
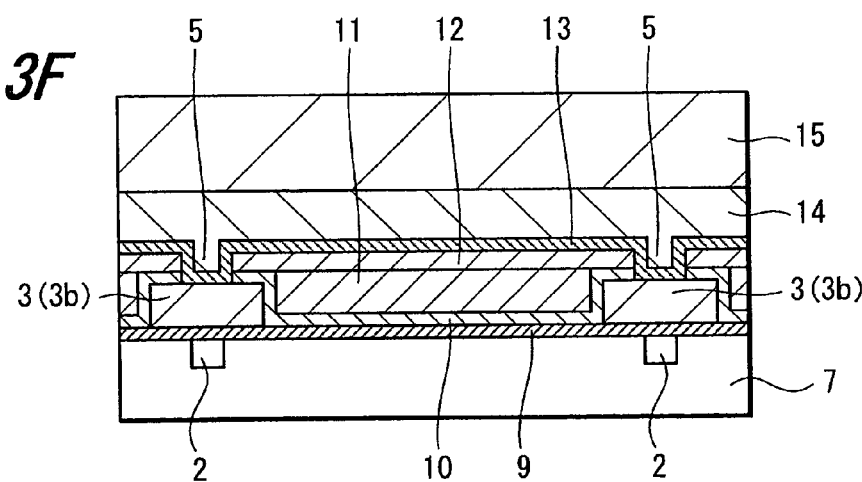

Next, as shown in FIG. 3F, a resist layer 15 is formed on the wiring material layer 14. At this time, since the planarized insulating layer 11 is buried above the light-sensing portion 4 after the polysilicon for forming the transfer electrodes 3 is removed, the wiring material layer 14 is evenly formed, and the resist layer 15 is also evenly formed.

Figure 3G:
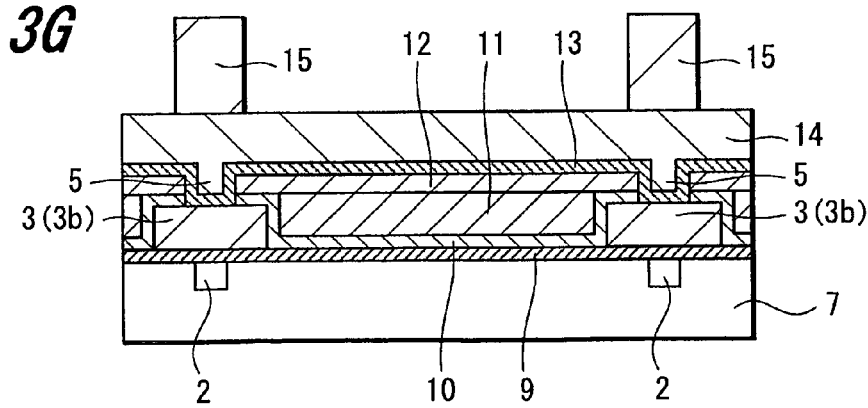

Further, as shown in FIG. 3G, the resist layer 15 is exposed and developed so that the resist layer 15 becomes a pattern in which the portions corresponding to the connection wirings 6 are left. In the present embodiment, since the resist layer 15 is evenly formed, the pattern of the resist layer 15 can be precisely formed in desired positions.

Figure 4H:
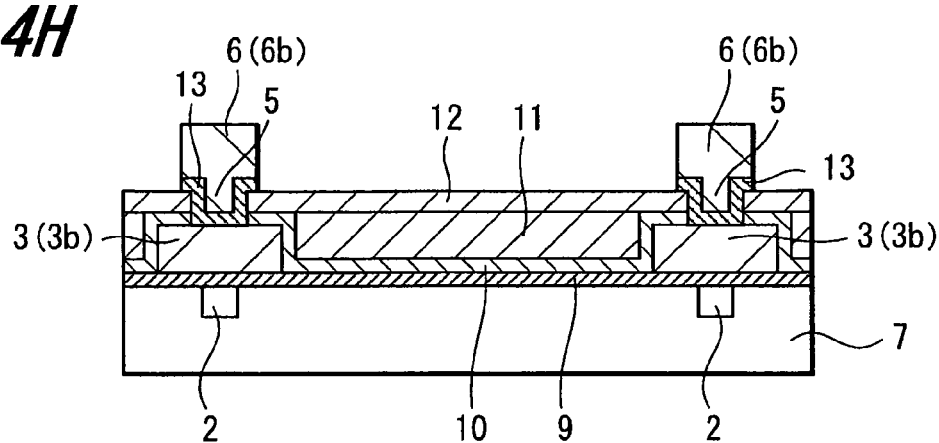
FIGS. 4H, 4I and 4J are views schematically showing steps (part 3) of the method for producing the solid-state imaging device according to the first embodiment of the present invention.

Further, unnecessary wiring material layer 14 and barrier metal layer 13 are removed by performing a dry etching method using the exposed and developed resist layer 15 as a mask until the insulating layer 12 is exposed. Thereby, as shown in FIG. 4H, the connection wirings 6 connected to the transfer electrodes 3 through the contact portions 5 are formed.

In the present embodiment, as mentioned above, since the planarized insulating layer 11 is buried above the light-sensing portion 4 after the polysilicon for forming the transfer electrodes 3 is removed, the wiring material layer 14 and the resist layer 15 are evenly formed. Thus, the resist layer 15 can be precisely exposed and developed, and the connection wirings 6 can be precisely formed even when desired wiring width of the connection wirings 6 is very small.

Figure 7:
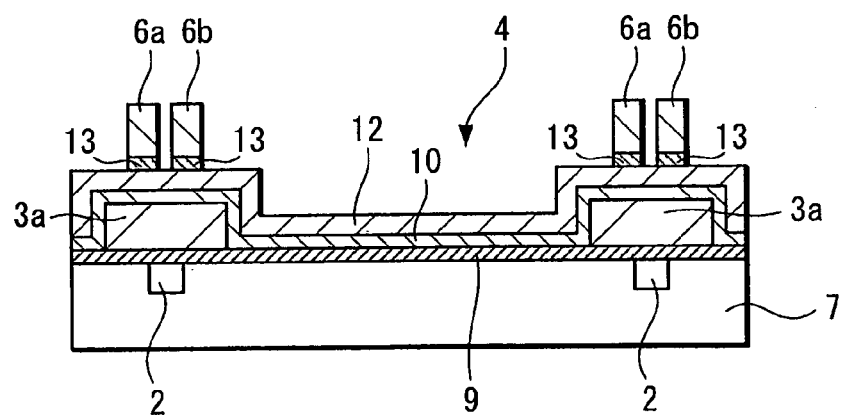
FIG. 7 is a view showing the structure of a cross section taken along line b-b of the solid-state imaging device according to the first embodiment of the present invention.

FIG. 7 shows the structure of a cross section taken along line b-b of FIG. 1B when forming the connection wirings 6 in the aforesaid steps. According to the present embodiment, as shown in FIG. 7, a stable pattern can be formed even when the two connection wirings 6a, 6b are arranged adjacent to each other with a very small distance. Thus, the connection wirings 6a, 6b can be formed in a stable manner in which the wiring width hardly varies even if the wiring is very thin and therefore susceptible to short-circuiting when being shifted even slightly.

Figure 4I:
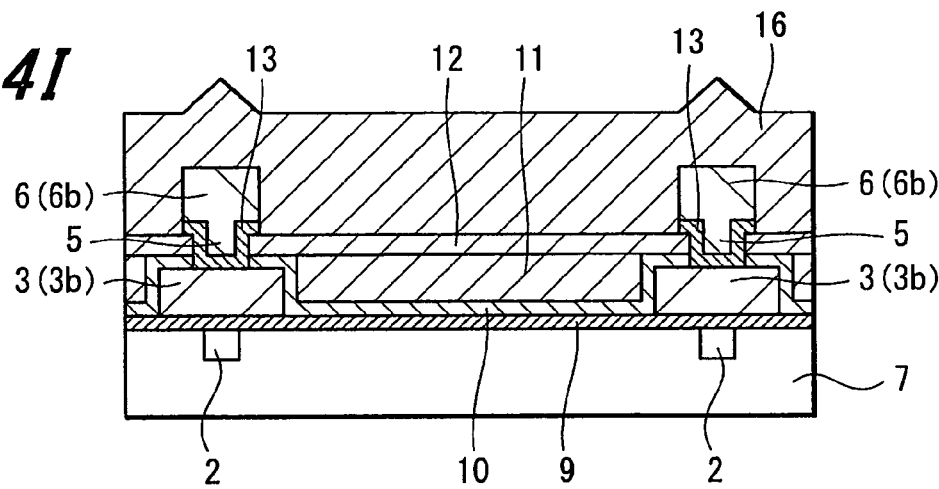

Next, as shown in FIG. 4I, an insulating layer 16 formed of, for example, silicon oxide is formed to bury the connection wirings 6 therein. The insulating layer 16 is formed to improve the voltage resistance between the connection wirings and a light shielding layer formed in a step described later. By using a HDP (high density plasma) method preferably, the insulating layer 16 can be easily formed and buried into the stepped portions formed between the connection wirings 6 and the insulating layer 12 formed in the previous steps.

When forming the insulating layer 16 to bury the connection wirings 6 therein, there are stepped portions formed on the surface of the formed insulating layer 16 in the area corresponding to the connection wirings 6.

Figure 4J:
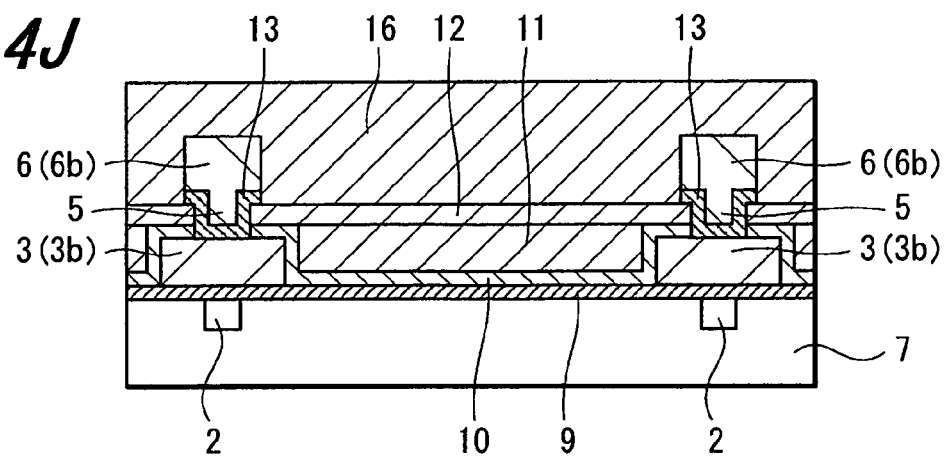

To eliminate the stepped portions, the surface of the insulating layer 16 having stepped portions is planarized using a CMP method as shown in FIG. 4J.

Figure 5K:
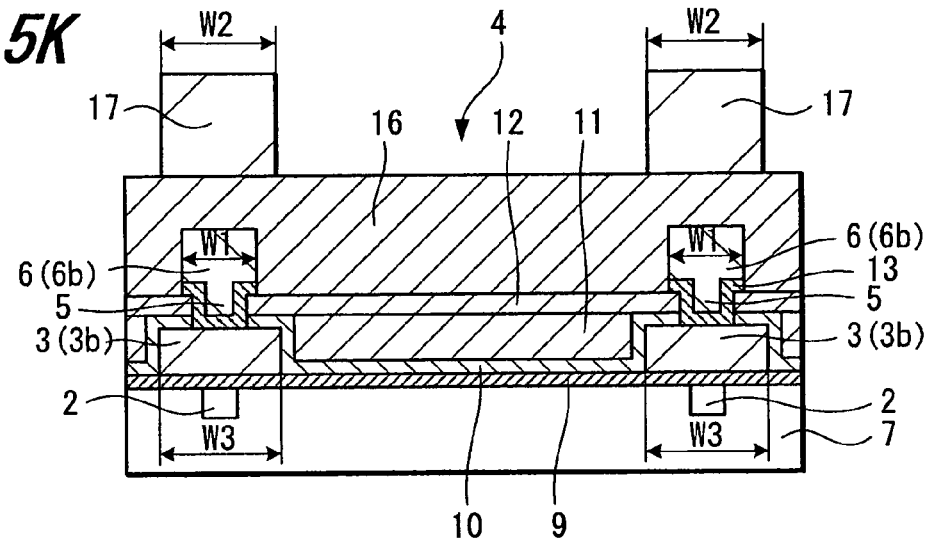
FIGS. 5K, 5L and 5M are views schematically showing steps (part 4) of the method for producing the solid-state imaging device according to the first embodiment of the present invention.
Figure 8:
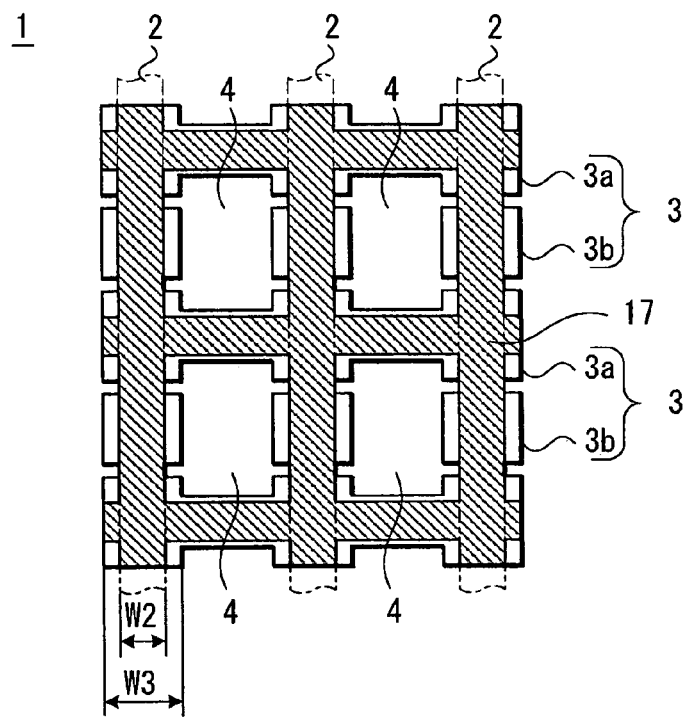
FIG. 8 is a plan view schematically showing a pattern of a resist layer.

Thereafter, as shown in FIG. 5K, a resist layer 17 is coated on the planarized insulating layer 16, and the coated resist layer 17 is exposed and developed so as to form a pattern in which the resist layer 17 in the area excluding the light-sensing portions 4 is left. The wiring width W2 of the resist layer 17 is larger than the wiring width W1 of the connection wirings 6a above the second transfer electrodes. Further, the wiring width above the first transfer electrodes 3a is formed larger than a length covering both the connection wirings 6a, 6b. The wiring width W2 of the resist layer 17 is smaller than the wiring width W3 of the transfer electrodes 3. FIG. 8 schematically shows a plane configuration of the exposed and developed resist layer at this time. The wiring width W2 of the resist layer 17 determines the thickness of the insulating layer covering the connection wirings 6, and at the same time affects the opening area of the light-sensing portions 4. In the present embodiment, since the resist layer 17 is formed on the planarized insulating layer 16, the resist layer 17 can be precisely exposed and developed. Thus, the pattern of the resist layer 17 can be precisely formed in desired positions.

Figure 5L:
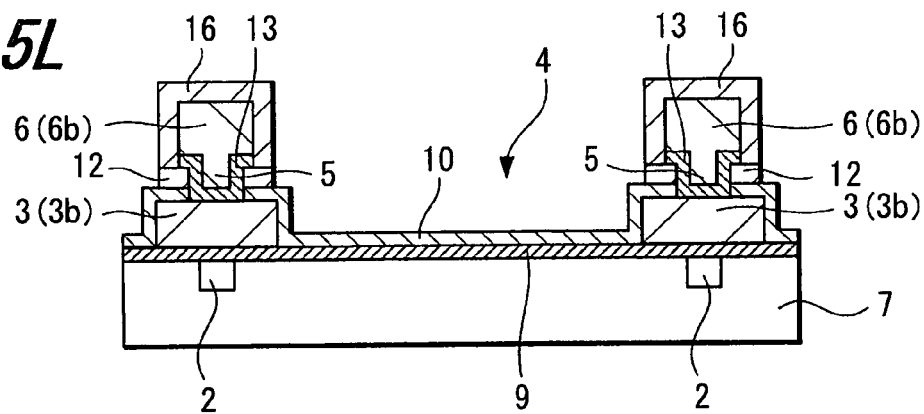

Further, as shown in FIG. 5L, a dry etching method is performed to remove the extra laminated insulating layers 11, 12, 16 until the silicon nitride layer 10 is exposed. At this time, the underlying silicon nitride layer 10 is used as a stopper, and thereby the insulating layers 11, 12, 16 can be removed while the remaining layer is precisely controlled. In the present embodiment, since the wiring width W2 of the resist layer 17 is larger than the wiring width W1 of the connection wirings 6, the insulating layer 16, which is formed to bury the connection wirings 6 therein, is formed to cover the side surfaces and the upper surfaces of the connection wirings 6. Further, since the insulating layer 16 is planarized in the previous steps, the resist layer 17 can be evenly formed, and therefore can be precisely exposed and developed. Thus, it is possible to finely adjust the wiring width W2 of the patterned resist layer 17 formed by being exposed and developed. Thus, the thickness of the insulating layer 16 formed on the side surface of the connection wirings 6 can be reduced.

Figure 5M:
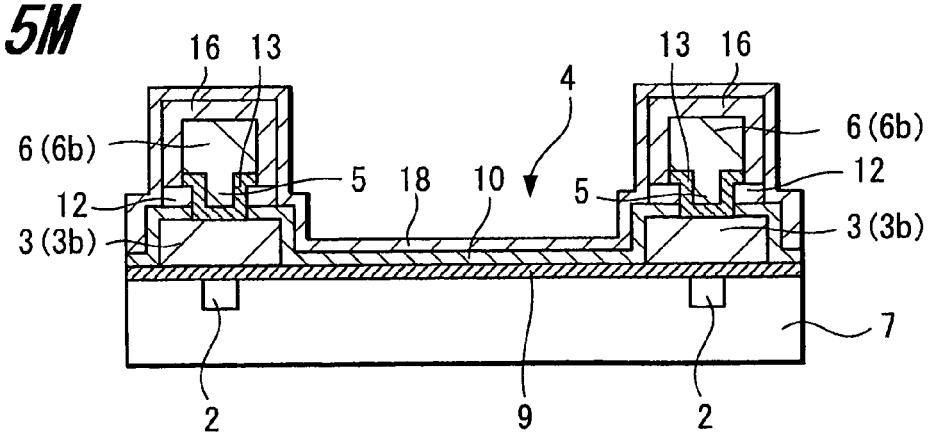

Thereafter, as shown in FIG. 5M, a thin insulating layer 18 formed of silicon oxide is formed on the entire surface to cover the silicon nitride layer 10 exposed in the previous steps. The insulating layer 18 is formed in order to protect the silicon nitride layer 10 from being etched by an etching gas used in the next step.

Figure 6N:
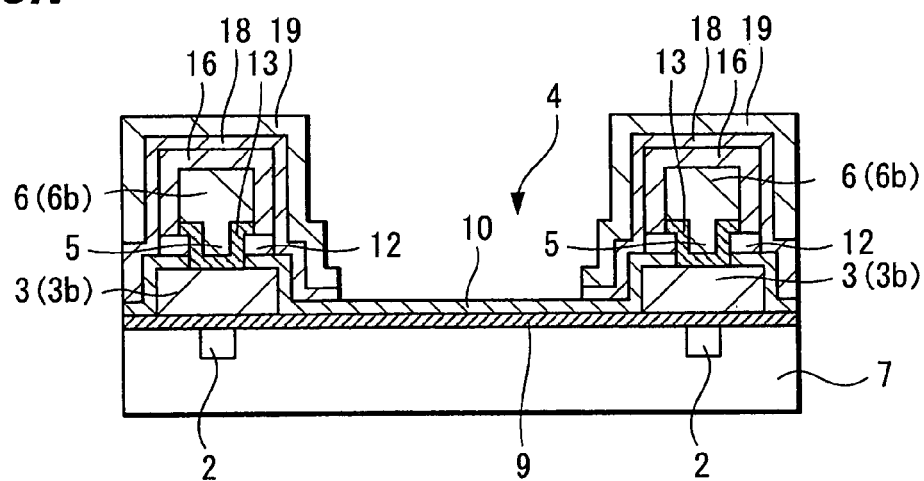
FIG. 6N is a view schematically showing a step (part 5) of the method for producing the solid-state imaging device according to the first embodiment of the present invention.
Figure 9:
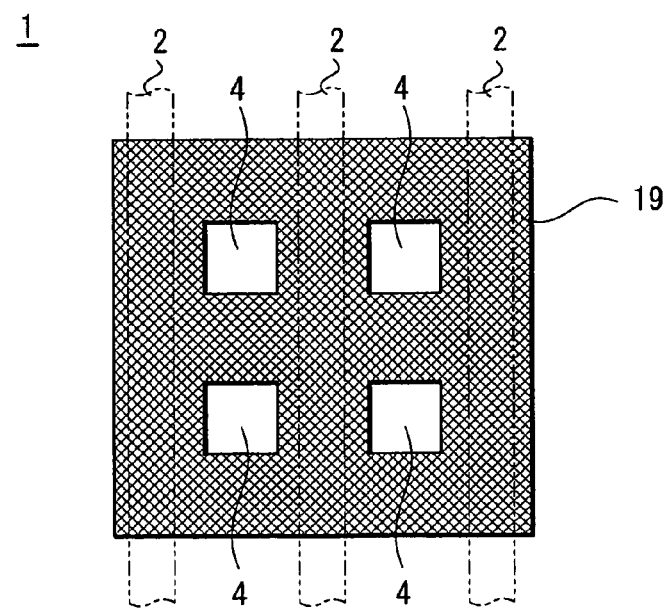
FIG. 9 is a plan view schematically showing a pattern of a light shielding layer.

Further, as shown in FIG. 6N, a light shielding layer 19 formed of, for example, aluminum (Al) or tungsten (W) is formed on the entire surface, and thereafter the insulating layer 18 and the light shielding layer 19 in the area corresponding to the light-sensing portion 4 is removed by using a lithography method. FIG. 9 is a plan view schematically showing the light shielding layer 19 formed in the present embodiment.

In the case where the lithography method is used for etching the light shielding layer 19, chloride gas or sulfur fluoride, for example, can be used as the etching gas. Although these gases have high etching speed to the silicon nitride layer 10, since the insulating layer 18 formed of silicon oxide is formed on the silicon nitride layer 10 in the previous steps, the silicon nitride layer 10 can be prevented from being etched. Also, since the silicon nitride layer 10 is not etched, the silicon nitride layer 10 can be used as the antireflection layer.

In the present embodiment, since the insulating layer 16 formed on the side surface of the connection wirings 6 can be formed thin in steps shown in FIGS. 5K and 5L, the distance between the light shielding layer 19 and the semiconductor substrate 7 is reduced. Thus, the light passed into the transfer channel 2 from beneath the light shielding layer 19 can be reduced, and therefore the smear characteristic is improved.

Further, the insulating layer 16 on the side surface of the connection wirings 6 can be formed thin, and thereby the opening area of the light-sensing portion 4 can be increased.

Further, unlike a producing method in which the polysilicon of the light-sensing portion 4 is removed after the connection wirings 6 have been formed, since the ions can be implanted before the connection wirings 6 is formed even in the case where ions are implanted into the light-sensing portion 4 to a region corresponding to the shape of the polysilicon of the light-sensing portion 4, there is no concern that metal contamination will be caused.

The present embodiment is described using an example in which the insulating layer 16 is formed and planarized using the CMP method in the step after the connection wirings 6 have been formed, that is, in the step shown in FIG. 4J. However, a resist etch-back method can be used instead wherein a thick resist layer is used.

Figure 10A:
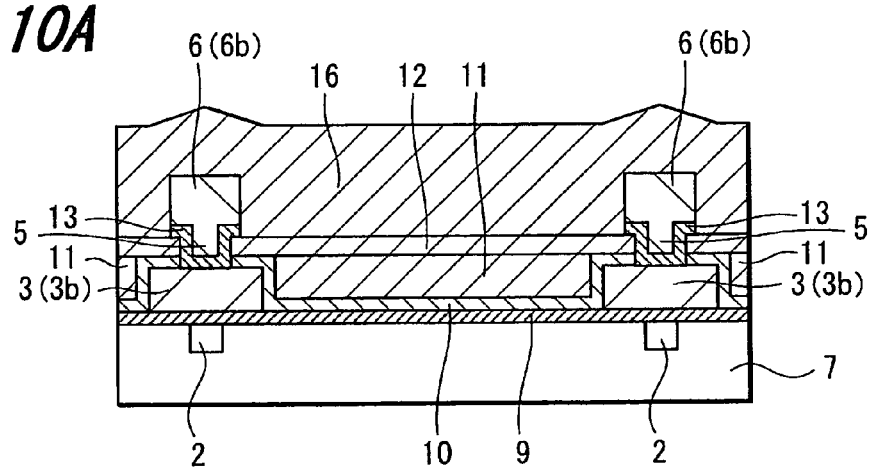
FIGS. 10A, 10B and 10C are views showing steps of another example of the method for producing the solid-state imaging device according to the first embodiment of the present invention.
Figure 10B:
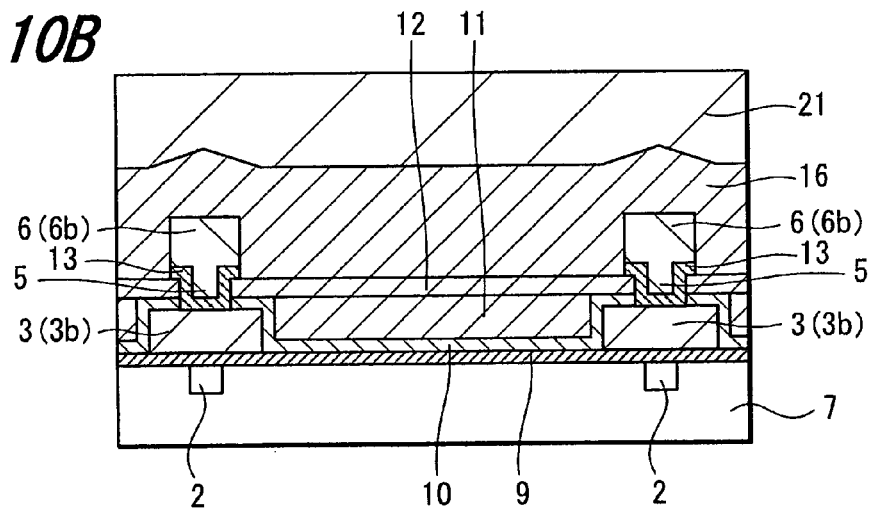
Figure 10C:
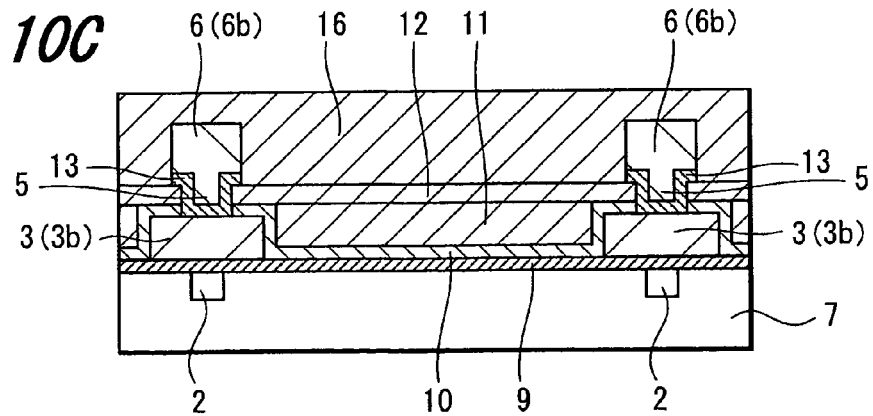

In such a case, after the insulating layer 16 is formed as shown in FIG. 10A, a thick resist layer 21 is formed on the insulating layer 16 without planarizing the insulating layer 16 as shown in FIG. 10B. Next, the resist etch-back method is performed in an etching condition in which the etching selectivity of the resist layer 21 to the insulating layer 16 is 1:1. As a result, the insulating layer 16 is planarized as shown in FIG. 10C. The steps thereafter are identical to those shown in FIGS. 5K to 6N.

A method for producing a solid-state imaging device according to a second embodiment will be described below with reference to FIGS. 11A to 11D and FIGS. 12E to 12G. Since a plane configuration of a primary portion of a solid-state imaging device formed by the method for producing a solid-state imaging device according to the second embodiment of the present invention is identical to that shown in FIGS. 1A and 1B, the description thereof is omitted herein. Note that, in FIGS. 11A to 11D and FIGS. 12E to 12G, like components are denoted by like numerals as of the FIGS. 2A to 6N and the explanation thereof will be omitted.

In the present embodiment, the contact portions and the connection wirings are formed by a dual damascene method.

First, in the present embodiment, steps identical to the steps shown in FIGS. 2A to 2C of the first embodiment are performed.

Figure 11A:
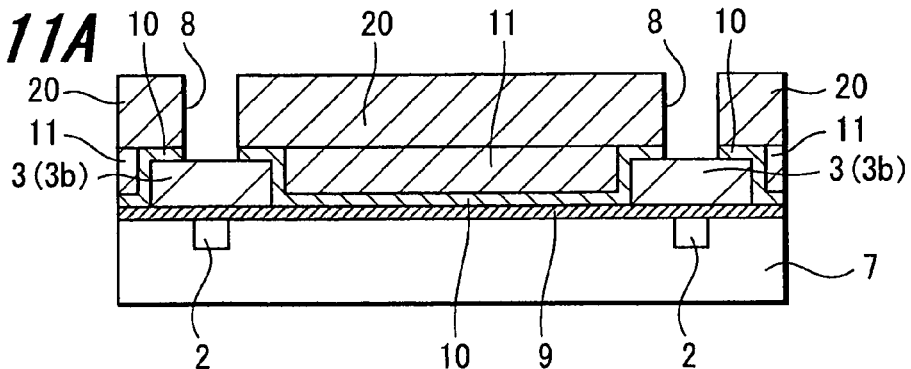
FIGS. 11A, 11B, 11C and 11D are views schematically showing steps (part 1) of a method for producing the solid-state imaging device according to a second embodiment of the present invention.

Next, after the insulating layer 11 is planarized as shown in FIG. 2C, an insulating layer 20 is further formed as shown in FIG. 11A. The thickness of the insulating layer 20 is about 5 nm to 500 nm. Further, a part of the insulating layer 20 in a desired area corresponding to the transfer electrodes 3 is removed by etching to expose the transfer electrodes 3, and thereby the openings 8 are formed. In a step described later, the wiring material layer 14 is buried into the openings 8 to form the contact portions 5 which connect the transfer electrodes 3 with the connection wirings 6.

Figure 11B:
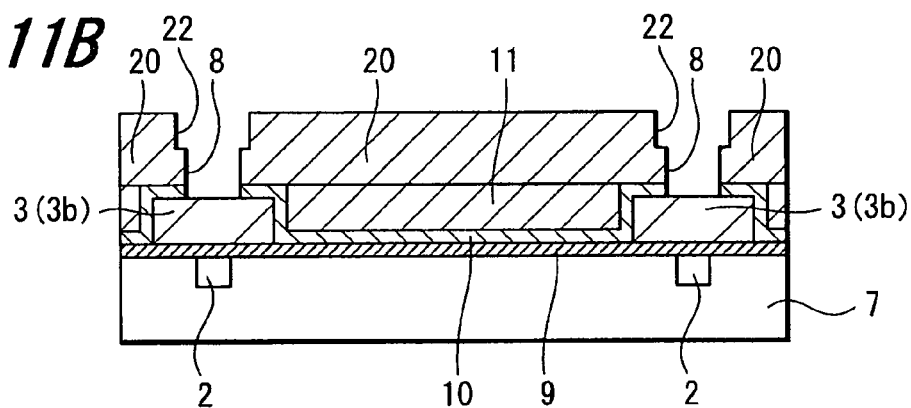
Figure 11C:
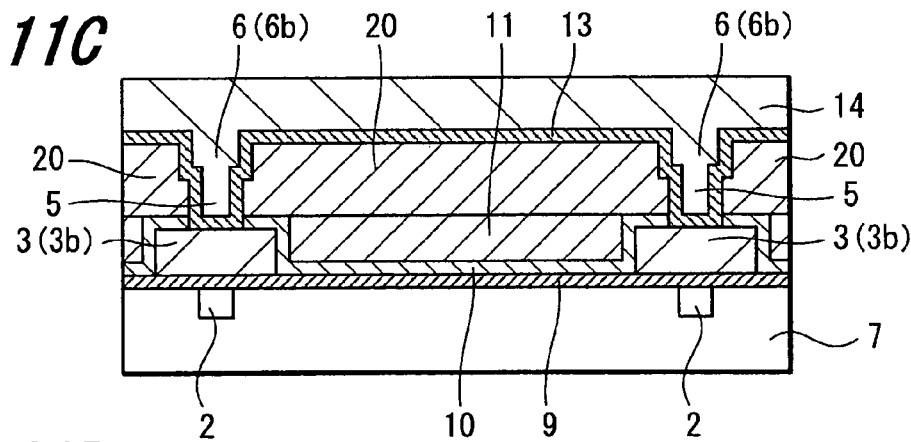

Next, as shown in FIG. 11B, the insulating layer 20 in the area corresponding to the connection wirings 6 is etched to form wiring grooves 22 for the connection wirings 6. In a step described later, the wiring material layer 14 is buried into the wiring grooves 22 to form the connection wirings 6. Thus, the wiring grooves 22 are formed into a pattern of the connection wirings 6a, 6b shown in FIG. 1B.

The openings 8 and the wiring grooves 22 are formed in a state where the insulating layer 11 has been planarized in the step shown in FIG. 2C. Therefore, the patterns for forming the openings 8 and the wiring groove 22 are formed in a state where there is no stepped portion formed on the surface of the insulating layer 20. Thus, when performing the lithography method for forming the openings 8 and the wiring grooves 22, since there is no unevenness in thickness and shape of the resist layer, the openings 8 and the wiring grooves 22 can be precisely formed. Thus, since the size of the openings 8 and the wiring grooves 22 in plan view remains constant, neither poor connection between the connection wirings 6a, 6b nor decrease in yield will be caused due to reduced openings 8 and wiring grooves 22. Thus, reliability of the connection between the transfer electrodes 3 and the connection wirings 6 can be achieved.

Next, as shown in FIG. 3C, the wiring material layer 14 is formed so that the openings 8 and the wiring groove 22 are buried with the wiring material layer 14. In the present embodiment, a barrier metal layer 13 formed of a titanium (Ti) layer and a titanium nitride (TiN) layer is formed first, and thereafter the wiring material layer 14 formed of tungsten (W) is formed. The contact portions 5 and the connection wirings 6 are formed by burying the openings 8 and the wiring grooves 22 with the wiring material layer 14. The barrier metal layer 13 formed of a titanium layer and a titanium nitride layer is formed between the tungsten (which forms the connection wirings 6 and the contact portion 5) and the polysilicon (which forms the transfer electrodes 3), and thereby even at the time when performing the heat treatment at a high temperature of 800° C. or higher in a step described later, the adhesion between the polysilicon and the tungsten can be improved by the barrier metal layer 13, and a stable contact resistance can be obtained. Also, since the stable contact resistance can be obtained, not only there is merit in obtaining a stable low wiring resistance, but also it becomes possible to obtain a highly reliable wiring structure.

Note that, although the present embodiment is described using an example in which tungsten is used as the material of the wiring material layer 14, the present invention is not limited thereto. For example, the wiring material layer 14 may also be formed of other materials such as aluminum (Al), titan (Ti), copper (Cu), tantalum (Ta) and cobalt (Co), or their nitrides, silicides, or a laminated structure of these.

Figure 11D:
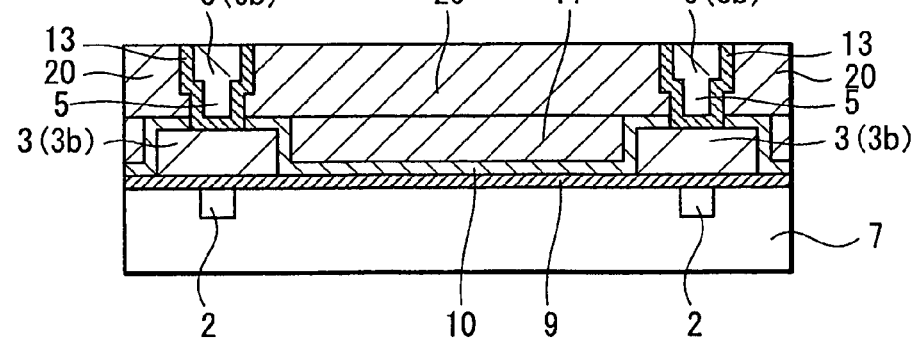

Thereafter, as shown in FIG. 11D, the wiring material layer 14 and the barrier metal layer 13 are polished using a CMP method until the insulating layer 20 is exposed.

By the above steps, the connection wirings 6 and the contact portions 5 for connecting the transfer electrodes 3 and the connection wirings 6 are formed.

Figure 12E:
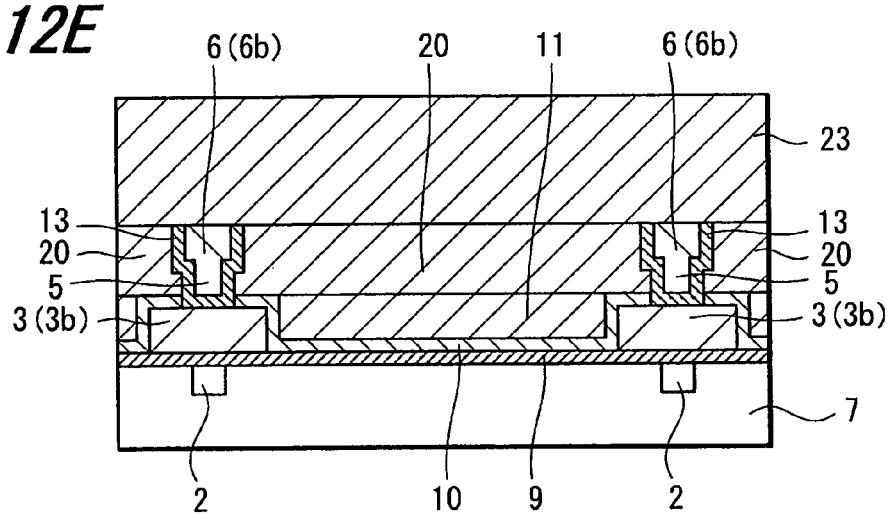
FIGS. 12E, 12F and 12G are views schematically showing steps (part 2) of the method for producing the solid-state imaging device according to the second embodiment of the present invention.

Next, as shown in FIG. 12E, an insulating layer 23 formed of the silicon oxide is formed to cover the connection wirings 6. At this time, since the underlying connection wirings 6 and insulating layer 20 are planarized, the insulating layer 23 can be evenly formed in this step.

Figure 12F:
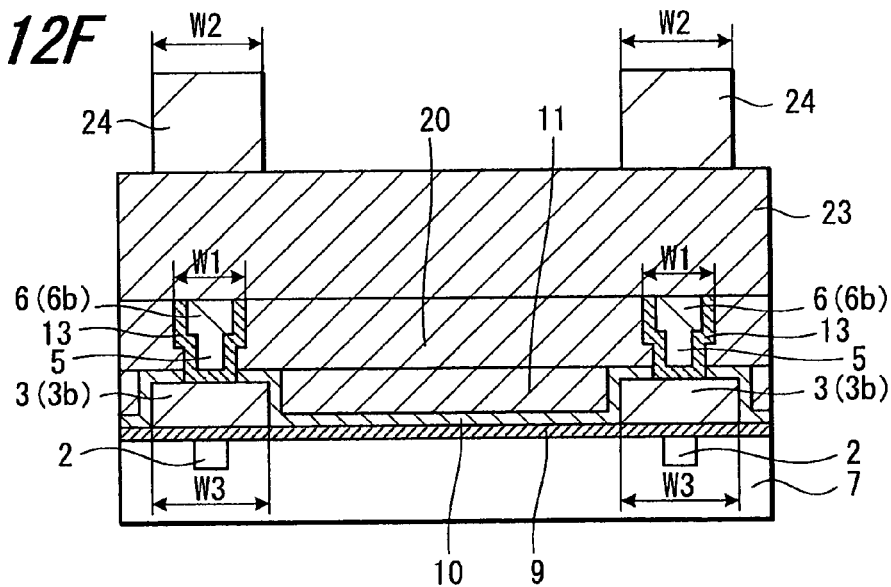

Thereafter, as shown in FIG. 12F, a resist layer 24 is coated on the evenly formed insulating layer 23, and then the coated resist layer 24 is exposed and developed so that a resist pattern is formed above the connection wirings 6. The wiring width W2 of the resist layer 24 is larger than the wiring width W1 of the connection wirings 6. Further, the wiring width above the first transfer electrodes is formed larger than a length covering both the connection wirings 6a, 6b. The wiring width W2 of the resist layer 24 is smaller than the wiring width W3 of the transfer electrodes 3. The plane configuration of the exposed and developed resist layer at this time is identical to that of the first embodiment shown in FIG. 8.

Figure 12G:
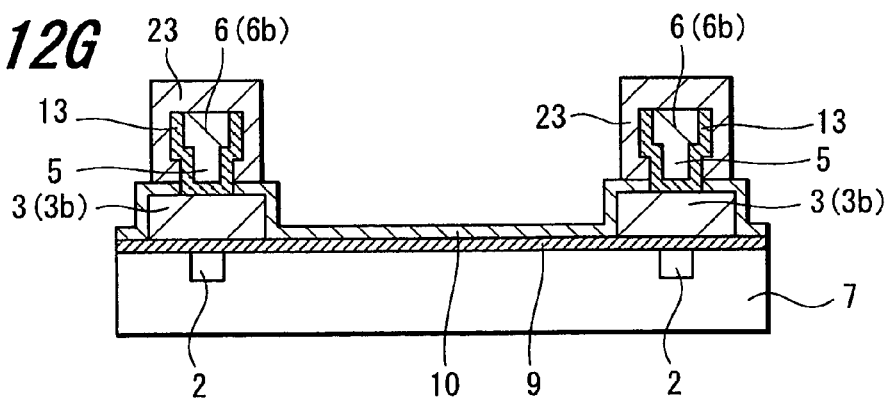

Further, as shown in FIG. 12G, a dry etching method is performed to remove the extra laminated insulating layers 11, 20, 23 until the silicon nitride layer 10 is exposed. At this time, the underlying silicon nitride layer 10 is used as a stopper, and thereby the insulating layers 11, 20, 23 can be removed while the remaining layer is precisely controlled. In the present embodiment, since the wiring width W2 of the resist layer 24 is larger than the wiring width W1 of the connection wirings 6, the insulating layer 23 is formed so as to cover the side surface and upper surface of the connection wirings 6. Further, since the insulating layer 20 and the insulating layer 23 covered on the insulating layer 23 have been planarized in the previous steps, the resist layer 24 can also be evenly formed and therefore can be precisely exposed and developed. Thus, it is possible to finely adjust the wiring width of the resist pattern formed by being exposed and developed. Thus, the thickness of the insulating layer formed on the side surface of the connection wirings 6 can be reduced.

Thereafter, steps identical to those of the first embodiment shown in FIGS. 5K to 6N are performed to form the light shielding layer, and thereby the solid-state imaging device is completed.

The same advantages as those of the first embodiment can also be achieved with the present embodiment.

Next, a method for producing a solid-state imaging device according to a third embodiment will be described below with reference to FIGS. 13A to 13C and FIGS. 14D and 14E. Since the solid-state imaging device formed by the method according to the third embodiment of the present invention is identical to that shown in FIGS. 1A and 1B, the description thereof is omitted herein. Further, in the present embodiment, since steps identical to the steps shown in FIGS. 2A to H4 are performed in the same manner as that of the first embodiment, the description of these steps will not be given again herein.

Figure 13A:
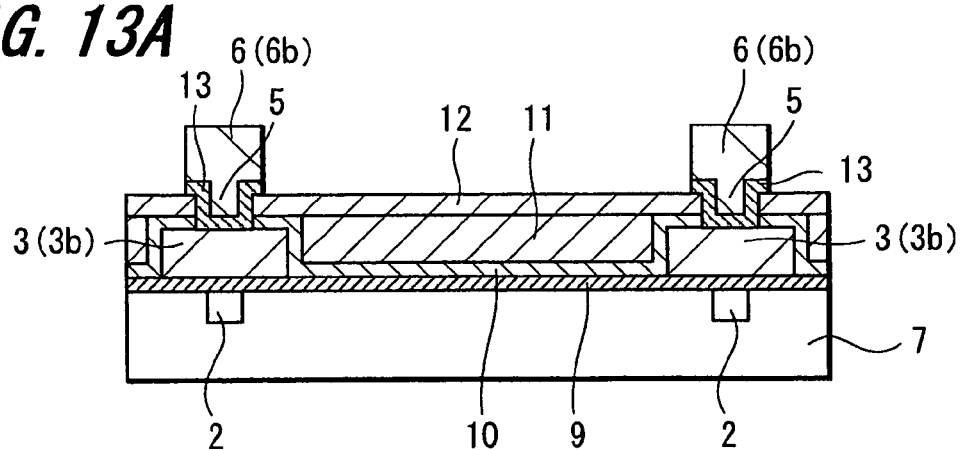
FIGS. 13A, 13B and 13C are views schematically showing steps (part 1) of a method for producing the solid-state imaging device according to a third embodiment of the present invention.
Figure 13B:
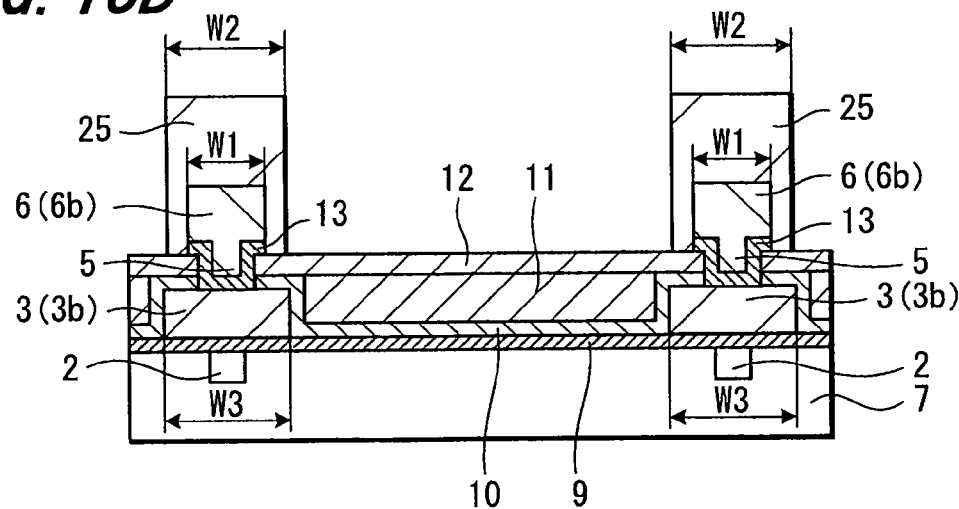

After the steps shown in FIGS. 2A to 4H are performed to form the connection wirings 6 as shown in FIG. 13A, a resist layer 25 is formed, and the formed resist layer 25 is exposed and developed so that a pattern of the resist layer 25 is formed on the connection wirings 6. The wiring width W2 of the resist layer 25 is larger than the wiring width W1 of the connection wirings 6a above the second transfer electrodes 3b. Further, the wiring width above the first transfer electrodes 3a is formed larger than a length covering both the connection wirings 6a, 6b. The wiring width W2 of the resist layer 25 is smaller than the wiring width W3 of the transfer electrodes 3. The plane configuration of the exposed and developed resist layer 25 at this stage is identical to that of the resist layer shown in FIG. 8.

Figure 13C:
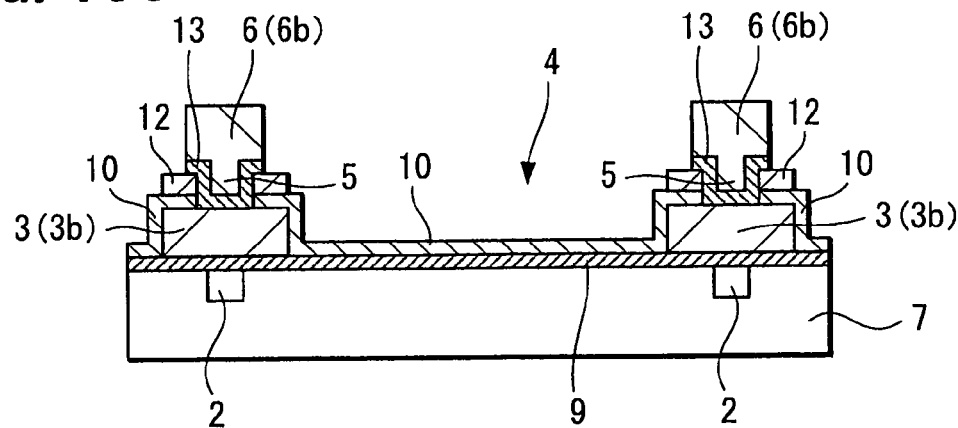

Further, as shown in FIG. 13C, the insulating layers 11, 12 are etched with the silicon nitride layer 10 as a stopper until the silicon nitride layer 10 is exposed, and the resist layer 25 is removed.

Figure 14D:
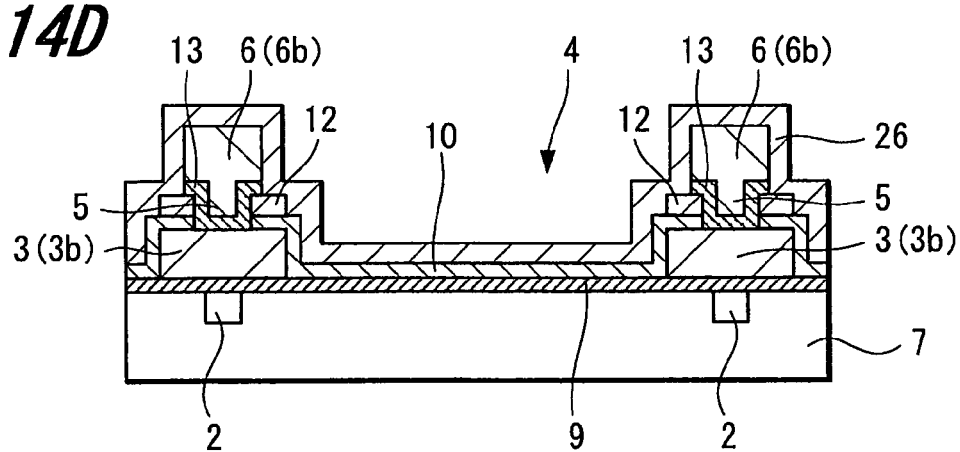
FIGS. 14D and 14E are views schematically showing steps (part 2) of the method for producing the solid-state imaging device according to the third embodiment of the present invention.

Next, as shown in FIG. 14D, an insulating layer 26 formed of the silicon oxide is formed on the entire surface.

Figure 14E:
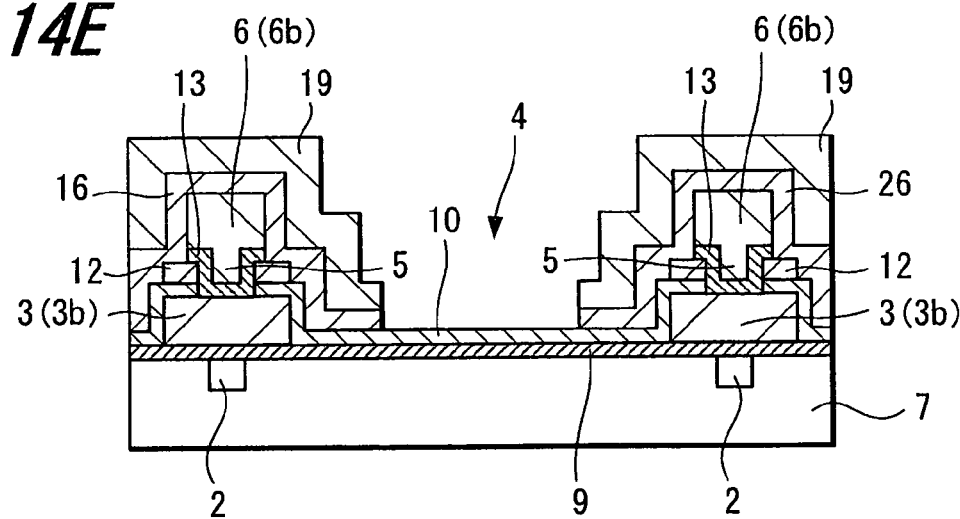

Thereafter, as shown in FIG. 14E, the light shielding layer 19 formed of, for example, tungsten (W) or aluminum (Al) is formed on the entire surface, and thereafter the insulating layer 26 and the light shielding layer 19 in the area corresponding to the light-sensing portion 4 is removed by using a lithography method until the silicon nitride layer 10 in the area corresponding to the light-sensing portion 4 is exposed. The plane configuration of the light shielding layer 19 formed according to the present embodiment is identical to that of the light shielding layer 19 shown in FIG. 9.

In the present embodiment, the solid-state imaging device 1 is formed by the above steps.

Compared with the first and second embodiments, since the insulating layer around the connection wirings 6 is formed without using the lithography method in the present embodiment, the number of steps can be reduced.

In the present embodiment, since the openings 8, in which the contact portions 5 are formed, can be formed in a state where the surface has been planarized like the first and second embodiments, no unevenness in size of the openings 8 is caused, and therefore the openings 8 can be precisely formed. Further, since the connection wirings 6 are formed in a state where the surface has been planarized, no unevenness in wiring width of the connection wirings 6 is caused, and therefore the connection wirings 6 can be precisely formed.

The methods for producing a solid-state imaging device according to the first, second and third embodiments can be applied not only to the solid-state imaging device shown in FIGS. 1A and 1B, but also to solid-state imaging devices shown in FIGS. 15A to 17B as described below.

Figure 15A:
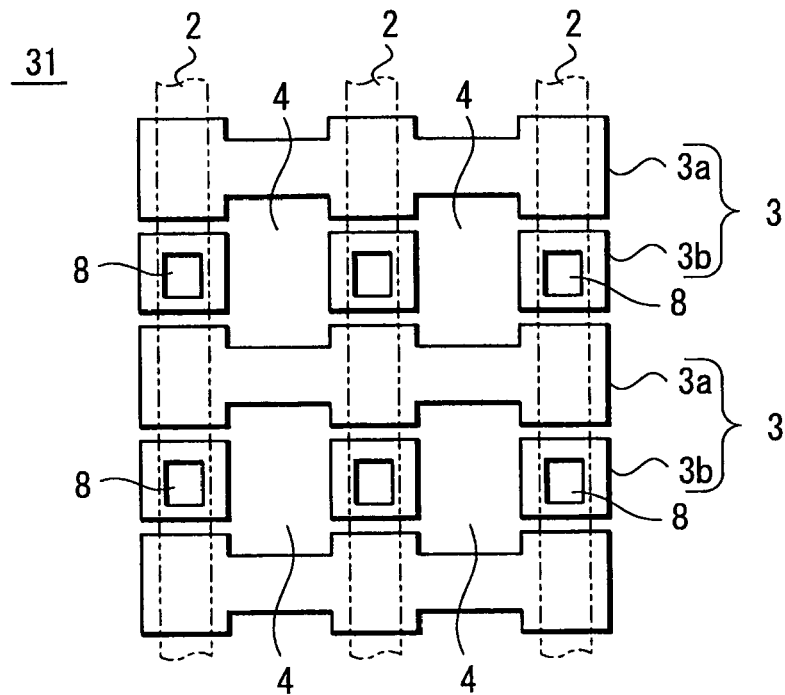
FIGS. 15A and 15B are plan views schematically showing a configuration of a primary portion of another example of the solid-state imaging device formed by the first to third embodiments of the present invention.
Figure 15B:
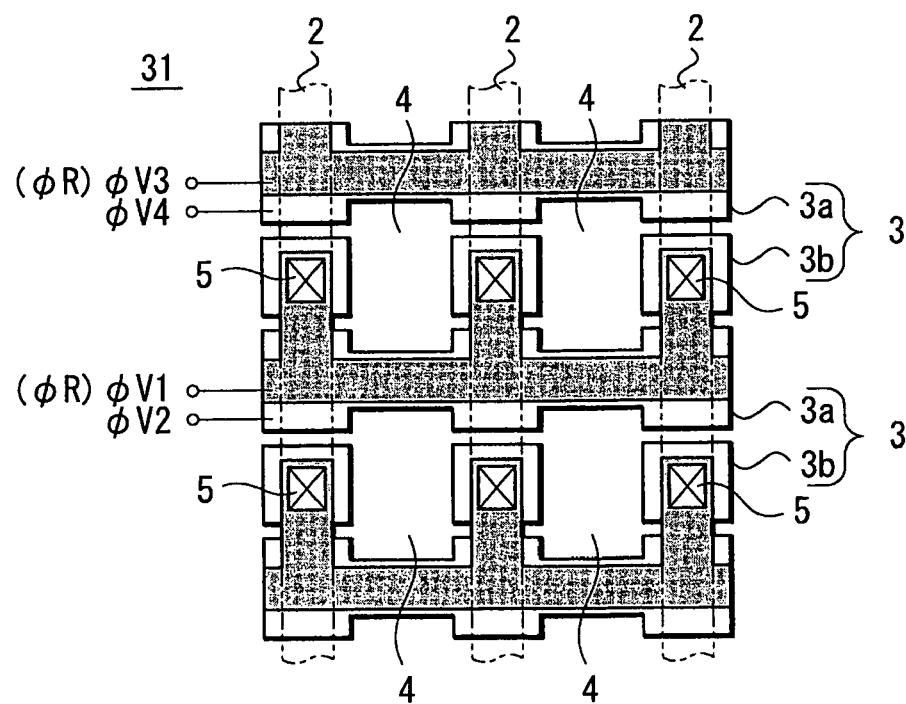

FIGS. 15A and 15B show a solid-state imaging device 31, which is an example in which the opening 8 is formed only in each of floating island shaped second transfer electrodes 3b, and the connection wirings 6 are connected only to the transfer electrodes 3 through the contact portions 5. FIG. 15A shows only the transfer electrodes 3, and FIG. 15B shows both the transfer electrodes 3 and the connection wirings 6. Note that, in FIGS. 15A and 15B, like components are denoted by like numerals as of the FIGS. 1A and 1B and the description thereof will be omitted.

In the present embodiment, the transfer pulses $\phi V2$, $\phi V4$ are alternately and repeatedly supplied to the first transfer electrodes 3a alternately and repeatedly arranged. Further, the transfer pulses $\phi V1$, $\phi V3$ are alternately supplied to the floating island shaped second transfer electrodes 3b adjacent to the light-sensing portions 4 through the connection wirings 6.

In the solid-state imaging device 31, after the signal charges are read out to the transfer channels 2, the transfer pulses $\phi V2$, $\phi V4$ are supplied to the first transfer electrodes 3a, and the transfer pulses $\phi V1$, $\phi V3$ are supplied to the second transfer electrodes 3b through the connection wirings 6. Further, the signal charges are read out along the vertical direction by the transfer pulses of four phases $\phi V1$-$\phi V4$.

The solid-state imaging device 31 shown in FIGS. 15A and 15B can be formed using the same steps as those of the first to third embodiments. As shown in FIGS. 15A and 15B, even in the case where only the floating island shaped second transfer electrodes 3b are provided with the contact portions 5 for connecting the connection wirings 6 to the second transfer electrodes 3b, the wiring width of the connection wirings 6 can be formed thin by forming the connection wirings 6 after the insulating layer has been planarized like the first to third embodiments.

The same advantages as those of the first to third embodiments can also be achieved.

Further, although the first to third embodiments are described using an example in which the connection wirings are formed of tungsten (W), the connection wirings may also be formed of, for example, polysilicon.

Figure 16A:
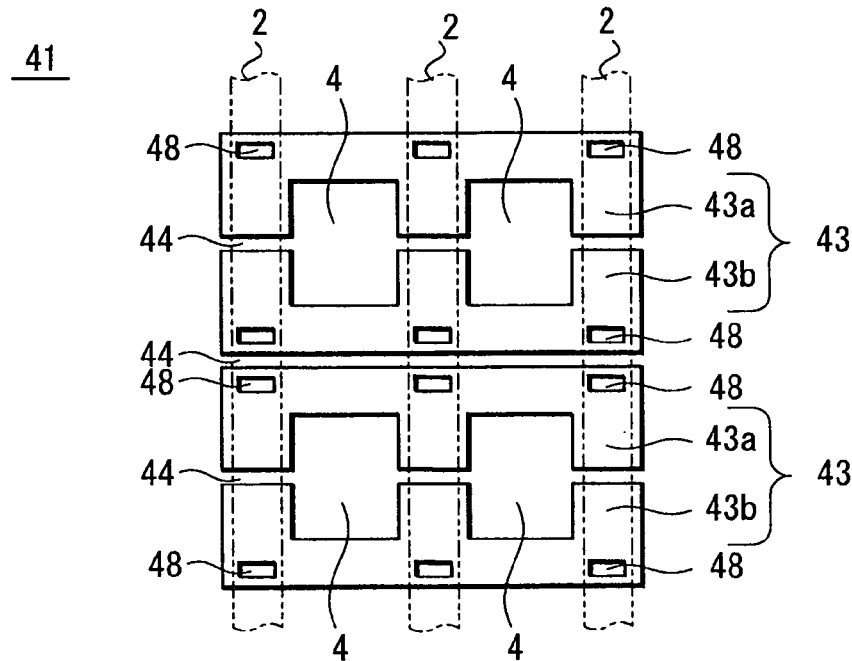
FIGS. 16A and 16B are plan views schematically showing a configuration of a primary portion of further another example of the solid-state imaging device formed by the first to third embodiments of the present invention.
Figure 16B:
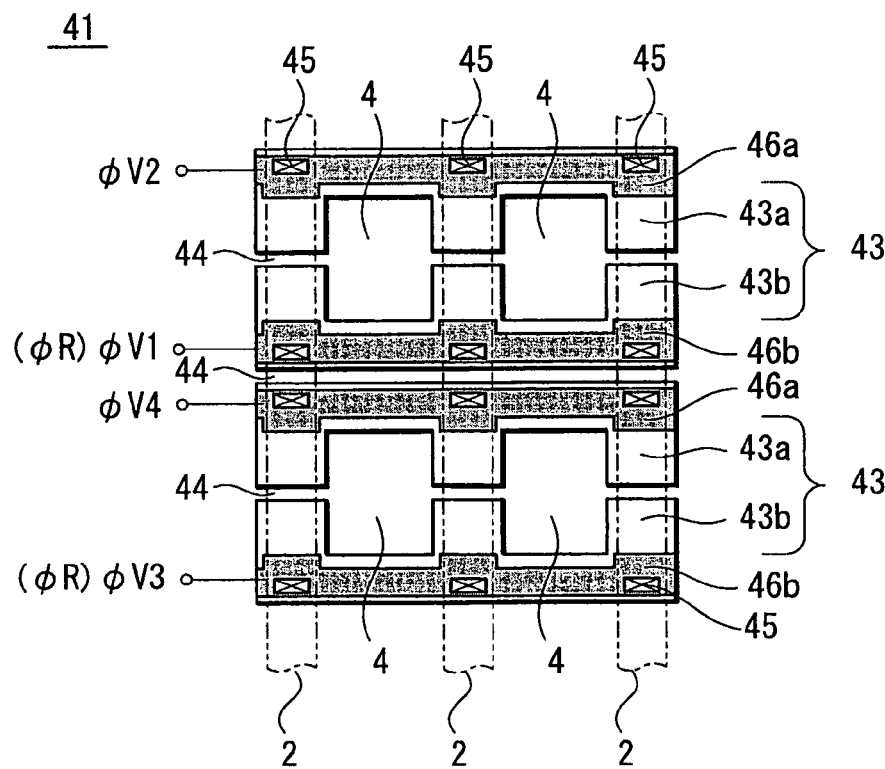

Next, a solid-state imaging device 41 shown in FIGS. 16A and 16B differs from the solid-state imaging device 1 shown FIGS. 1A and 1B in shape of the transfer electrodes. FIG. 16A shows only transfer electrodes, and FIG. 16B shows both the transfer electrodes and connection wirings.

In the solid-state imaging device 41, a plurality of first transfer electrodes 43a and a plurality of second transfer electrodes 43b are alternately formed in the vertical direction in the area excluding the light-sensing portions 4. Further, the solid-state imaging device 41 has a single layer electrode structure where the first transfer electrodes 43a and the second transfer electrodes 43b are formed in the same layer. Further, a gap 44 is formed between adjacent first transfer electrode 43a and second transfer electrode 43b, so that the first transfer electrode 43a and the second transfer electrode 43b are separated from each other.

As shown in FIG. 16A, openings 48 are formed in both the first transfer electrodes 43a and the second transfer electrodes 43b. Further, as shown in FIG. 16B, connection wirings 46a and connection wirings 46b are respectively connected to the first transfer electrodes 43a and the second transfer electrodes 43b via an insulating layer through contact portions 45 formed in the respective openings 48. The connection wirings 46a, 46b are formed of a material having low resistance, and therefore serve as shunt wirings.

The transfer pulses φV2, φV4 are supplied to the connection wirings 46a connected to the first transfer electrodes 43a, and the transfer pulses φV1, φV3 are supplied to the connection wirings 46b connected to the second transfer electrodes 43b. The signal charges accumulated in the light-sensing portions 4 are read out along the vertical direction by the transfer pulses of four phases φV1-φV4.

The solid-state imaging device 41 shown in FIGS. 16A and 16B can also be formed using the same steps as those of the first to third embodiments. In other words, by planarizing the insulating layer formed above the transfer electrodes 43 and then forming the openings 48, in which the contact portions 45 are to be formed, to form the connection wirings 46 like the first to third embodiments, the wiring width of the connection wirings 46 can be formed thin.

The same advantages as those of the first to third embodiments can also be achieved by applying the producing method of the first to third embodiments to the solid-state imaging device 41.

Although the solid-state imaging devices 1, 31, 41 are each a four-phase drive solid-state imaging device, the present invention is not limited thereto.

Figure 17A:
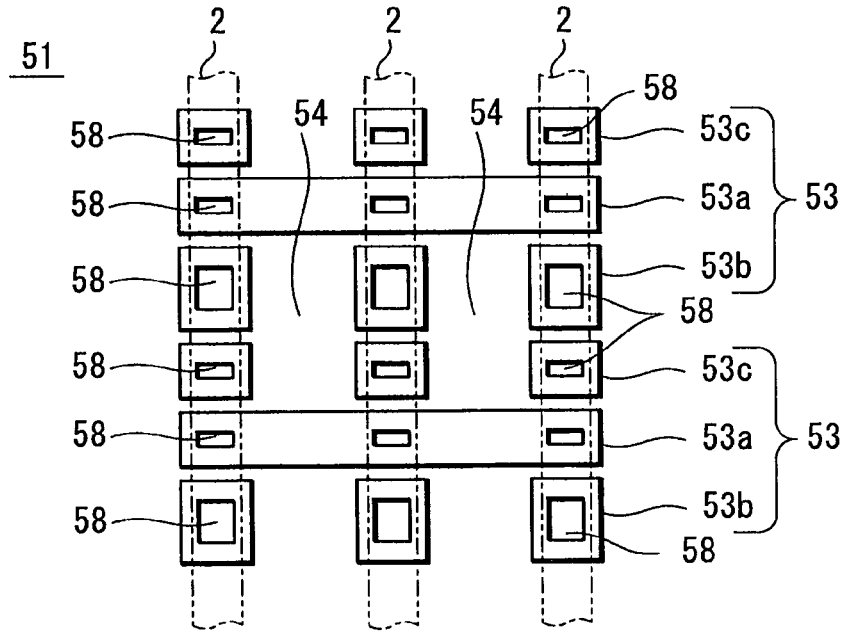
FIGS. 17A and 17B are plan views schematically showing a configuration of a primary portion of further another example of the solid-state imaging device formed by the first to third embodiments of the present invention.
Figure 17B:
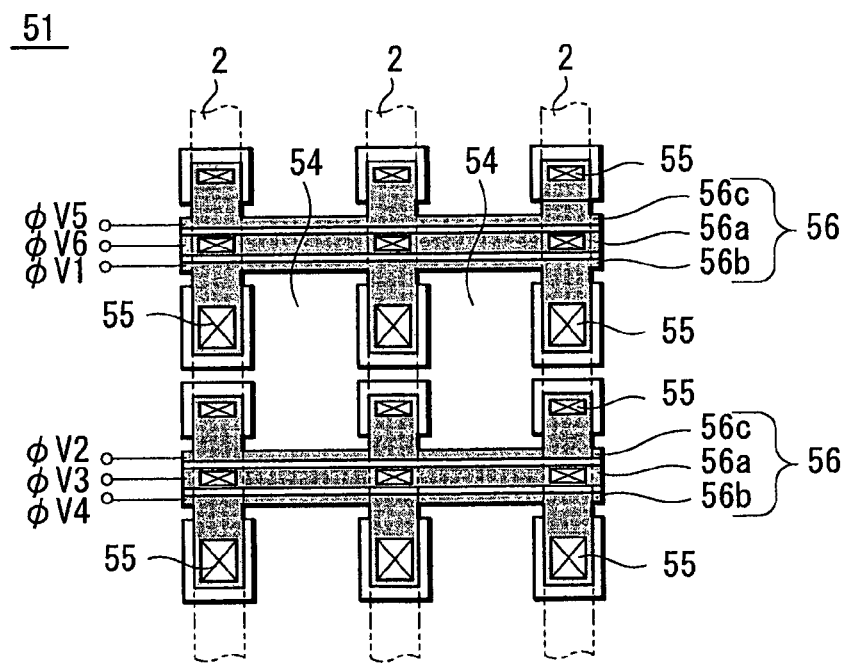

Next, FIGS. 17A and 17B show a solid-state imaging device which is driven by six phases caused by three the transfer electrodes. FIG. 17A shows only transfer electrodes of a solid-state imaging device 51, and FIG. 17B shows both the transfer electrodes and connection wirings of the solid-state imaging device 51. Note that, in FIGS. 17A and 17B, like components are denoted by like numerals as of the FIGS. 1A and 1B and the description thereof will be omitted.

In the solid-state imaging device 51 shown in FIG. 17A, first transfer electrodes 53a, second transfer electrodes 53b and third transfer electrodes 53c are alternately and repeatedly arranged on the transfer channels 2 in the vertical direction. The first transfer electrodes 53a, the second transfer electrodes 53b and the third transfer electrodes 53c are formed in the area excluding the light-sensing portions 4. The solid-state imaging device 51 has a single layer electrode structure where the first transfer electrodes 53a, the second transfer electrodes 53b and the third transfer electrodes 53c are formed in the same layer.

The first transfer electrodes 53a are connected to each other in the horizontal direction between the light-sensing portions 4 arranged in the vertical direction, and the second transfer electrodes 53b are each formed in a floating island shape on the transfer channels 2, that is, the second transfer electrodes 53b are separated and not connected to each other in the horizontal direction. Further, like the second transfer electrodes 53b, the third transfer electrodes 53c are each formed in a floating island shape on the transfer channels 2, that is, the third transfer electrodes 53c are separated and not connected to each other in the horizontal direction. The floating island shaped second transfer electrodes 53b and third transfer electrodes 53c are separated and not connected to each other in the horizontal direction, and thereby the light-sensing portions 4 are formed in the area where no second transfer electrodes 53b and third transfer electrodes 53c is formed.

Further, as shown in FIG. 17B, the first transfer electrodes 53a, the second transfer electrodes 53b and the third transfer electrodes 53c each have an opening 58 formed therein. Further, as shown in FIG. 17B, connection wirings 56a, 56b, 56c are respectively connected to the first transfer electrodes 53a, the second transfer electrodes 53b and the third transfer electrodes 53c through contact portions 55 formed in the respective openings 58. Further, each first transfer electrode has three connection wirings 56 (56a, 56b, 56c), which are connected to the transfer electrodes 53 (53a, 53b, 53c) through the contact portions 55, arranged thereon via an insulating layer, the three connection wirings 56 being placed side by side to extend in the horizontal direction. The connection wirings 56 are formed of a material having low resistance, and therefore serve as shunt wirings.

The first transfer electrodes 53a, the second transfer electrodes 53b and the third transfer electrodes 53c alternately and repeatedly arranged on the transfer channels 2 in the vertical direction are supplied with transfer pulses of six phases having different phases φV1, φV2, φV3, φV4, φV5 and φV6 along the vertical direction through the connection wirings 56.

The solid-state imaging device 51 can also be formed using the same steps as those of the first to third embodiments. In other words, by planarizing the insulating layer formed above the transfer electrodes 53 and then forming the openings 58 to form the connection wirings 56 like the first to third embodiments, the wiring width of the connection wirings 56 can be formed thin, and therefore thin connection wirings 56 can be precisely formed.

The same advantages as those of the first to third embodiments can also be achieved by applying the producing method of the first to third embodiments to the solid-state imaging device 51.

Although the above description is given using an example in which a the solid-state imaging device single layer electrode structure where the transfer electrodes are formed in the same layer, the first to third embodiments can also be applied to a solid-state imaging device in which transfer electrodes are formed in two layers laminated to each other, and connection wirings are formed on the transfer electrodes formed in such a manner.

In other words, the present invention can be applied to a method for producing a solid-state imaging device including steps of forming connection wirings which are connected to transfer wirings through contact portions.

The solid-state imaging device formed by the method for producing a solid-state imaging device according to the present invention can be used in electronic devices such as cameras and the like.

Figure 18:
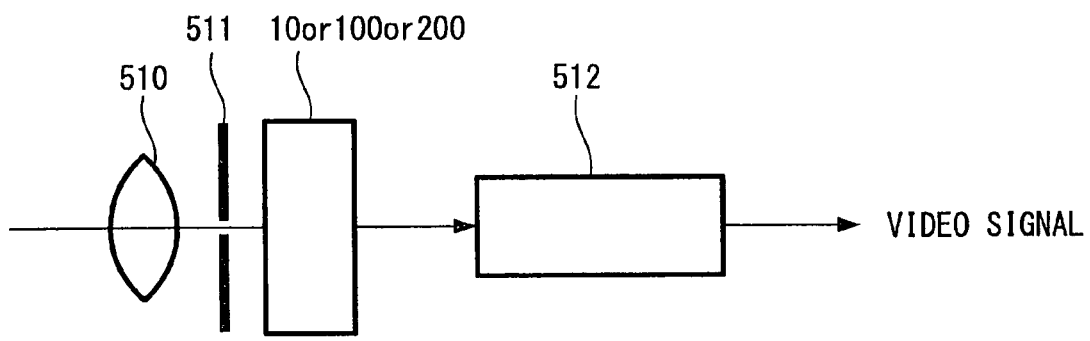
FIG. 18 is a view schematically showing a configuration of a camera using the solid-state imaging device formed according to the embodiments of the present invention.
Figure 19:
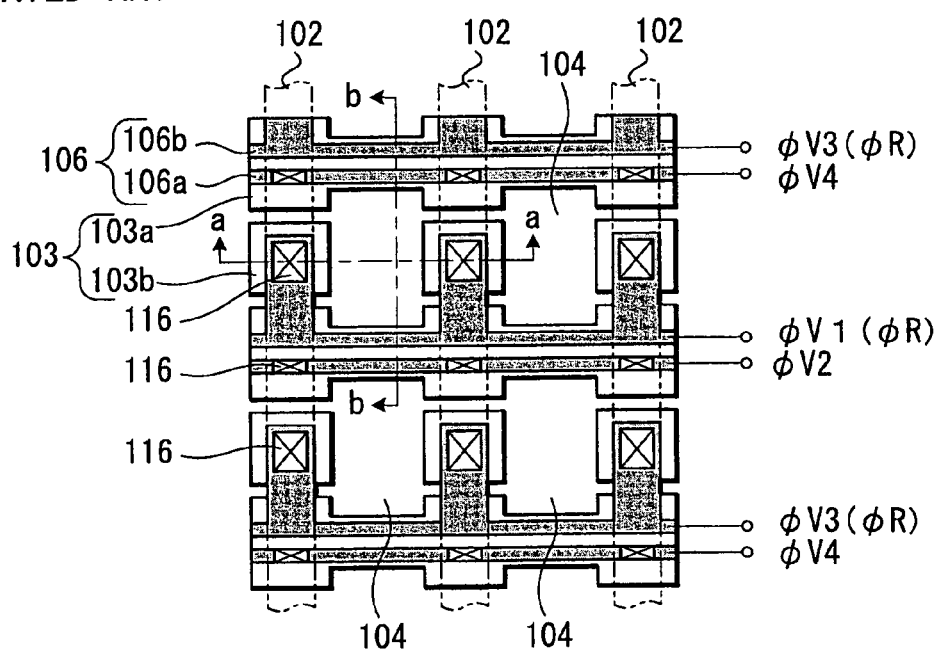
FIG. 19 is a view schematically showing a configuration of a primary portion of a pixel region of a solid-state imaging device according to a related art.
Figure 20A:
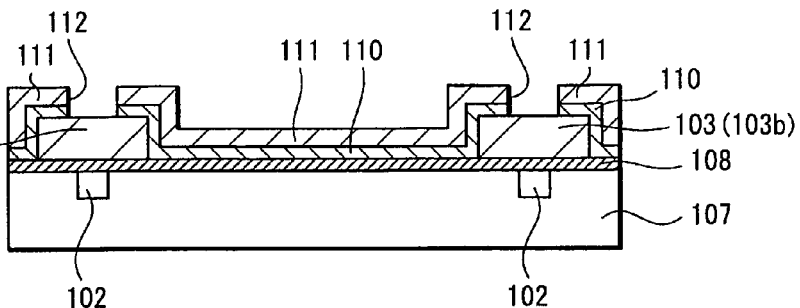
FIGS. 20A, 20B, 20C and 20D are views schematically showing steps (part 1) of a method for producing the solid-state imaging device according to the related art of the present invention.
Figure 20B:
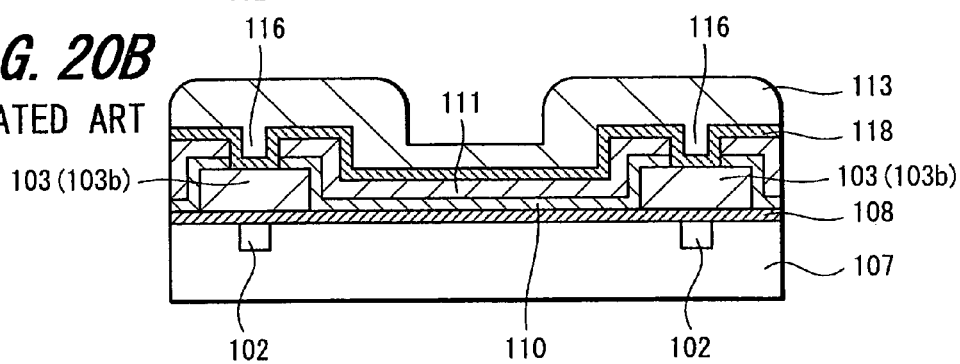
Figure 20C:
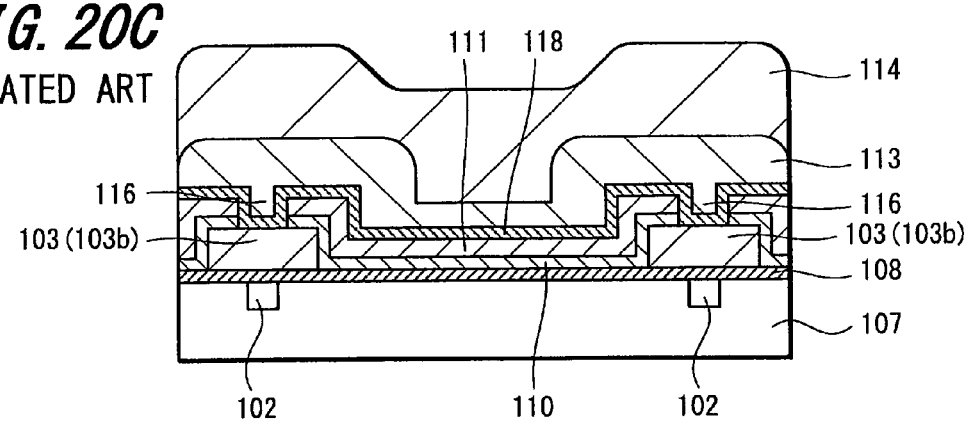
Figure 20D:
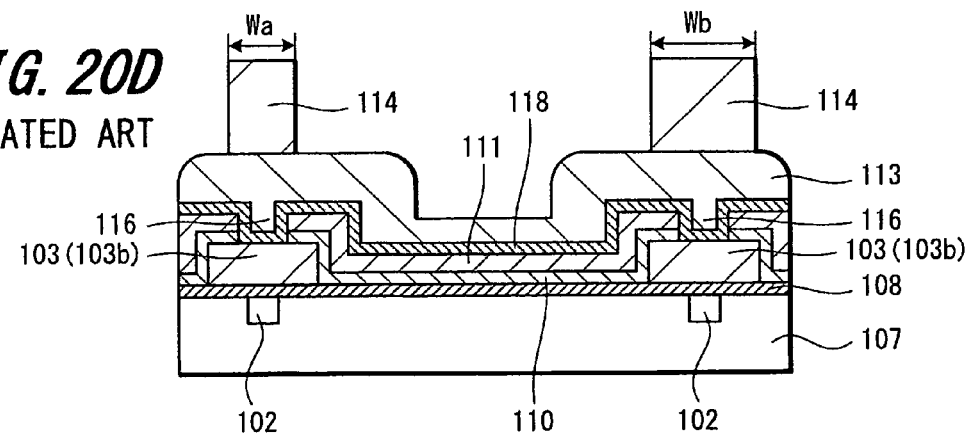
Figure 21E:
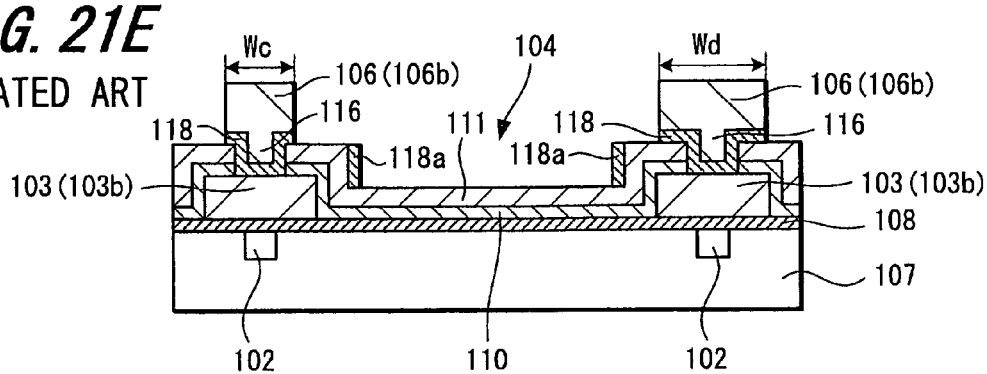
FIGS. 21E, 21F and 21G are views schematically showing steps (part 2) of the method for producing the solid-state imaging device according to the related art of the present invention.
Figure 21F:
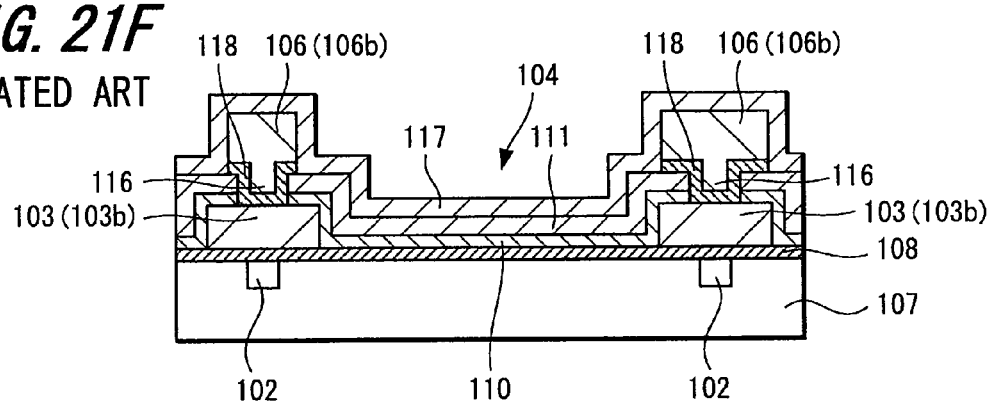
Figure 21G:
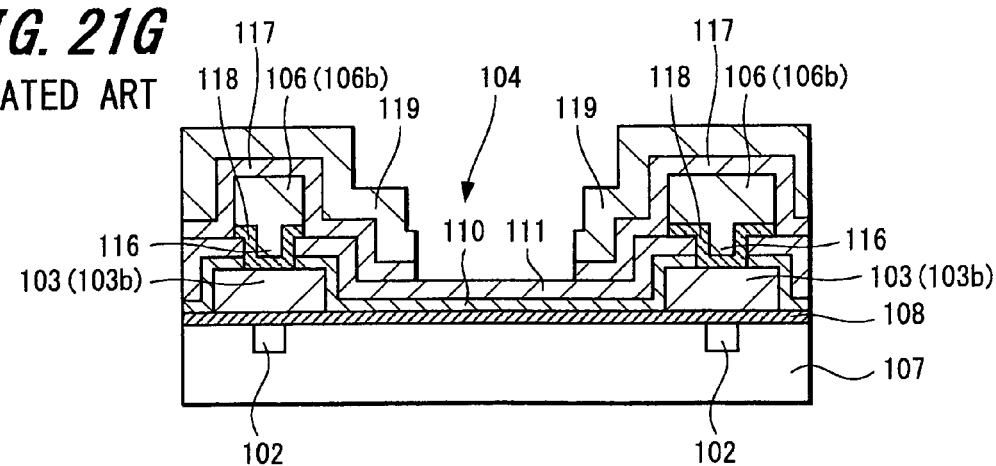
Figure 22:
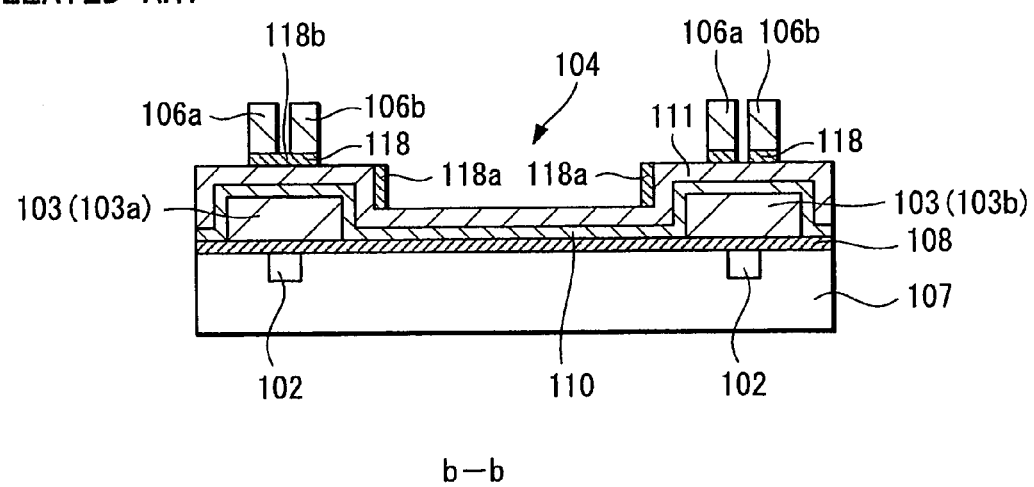
FIG. 22 is a view showing the structure of a cross section taken along line b-b of FIG. 19.

FIG. 18 schematically shows a configuration of a camera produced by a method for producing an electronic device, according to an embodiment of the present invention. The camera according to the present embodiment is an example of a video camera capable of taking an image of a still picture and/or a moving picture.

The camera according to the present embodiment includes an image sensor 10, 100, or 200, an optical system 510, a mechanical shutter device 511 and a signal processing circuit 512. Image light (incident light) from a subject is imaged on an imaging surface of the image sensor 10, 100, or 200 by the optical system 510. Thus, signal charges are accumulated in the image sensor 10, 100, or 200 for a predetermined period. The mechanical shutter device 511 controls the irradiation period and interrupting period of the light incident to the image sensor 10, 100, or 200.

The signal processing circuit 512 performs various kinds of signal processing. Video signal having been subjected to signal processing is stored in a storage medium such as a memory or outputted to a monitor. Although the present embodiment is described using an example in which the present invention is applied to the image sensor 10, 100, or 200 where unit pixels for detecting, as a physical quantity, the signal charges which correspond to quantity of visible light are arranged in matrix, the present invention is not limited thereto but can also be applied to general column type solid-state imaging devices in which a column circuit is provided for each of pixel columns of a pixel array unit.

Further, the present invention can also be applied to other type solid-state imaging devices such as a solid-state imaging device for imaging distribution of the amount of incident infrared ray, X-ray, particles or the like, a fingerprint detecting sensor for detecting and imaging distribution of other physical quantities including pressure, electrostatic capacitance and the like, instead of being limited to the solid-state imaging device for detecting and imaging distribution of the amount of incident visible light.

Further, the present invention can also applied to an X-Y address type solid-state imaging device in which arbitrary pixels are selected in pixel unit, and signals are read out in pixel unit from the selected pixels, instead of being limited to the solid-state imaging device in which the unit pixels of the pixel array unit are scanned in row unit sequentially and pixel signals are read out from the unit pixels.

Incidentally, the solid-state imaging device may either be formed as one chip, or be formed as a module-like structure which has imaging function and is formed by packaging an imaging section with a signal processing section or an optical system.

Further, the present invention can also be applied to an imaging apparatus, instead of being limited to the solid-state imaging device. Here, the imaging apparatus means electronic devices having imaging function such as a cell-phone, a camera system (such as a digital still camera and a video camera) and the like. Incidentally, the module-like structure mounted on the electronic device, namely a camera module, may be used as an imaging apparatus.

In the imaging apparatus such as a camera module used in a video camera, a digital still camera, a mobile device such as a cell-phone, by applying the image sensor 10, 10 or 200 to the solid-state imaging device of such an imaging apparatus, excellent image can be obtained with a simple configuration.

The present application contains subject matter related to that disclosed in Japanese Priority Patent Application JP 2008-110670 filed in the Japan Patent Office on Apr. 21, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for producing a solid-state imaging device, comprising steps of:
   a first step of forming transfer electrodes on a substrate having a plurality of light-sensing portions through a gate insulating layer so that the light-sensing portions are exposed;
   after the first step, a second step of forming a planarized insulating layer on the substrate to cover the transfer electrodes formed on the substrate;
   after the second step, a third step of forming openings in the planarized insulating layer so that each of the transfer electrodes has a part thereof exposed out of the planarized insulating layer at a predetermined position;
   after the third step, a fourth step of forming a wiring material layer so that the openings are filled with the wiring material layer;
   after the fourth step, a fifth step of forming a resist layer on the wiring material layer;
   after the fifth step, a sixth step of exposing and developing the resist layer so that only the resist layer in a predetermined area covering the openings is left; and
   after the sixth step, a seventh step of patterning the wiring material layer using the exposed and developed resist layer to form connection wirings which are connected to the transfer electrodes by the openings.

2. A method for producing a solid-state imaging device, comprising steps of:
   a first step of forming transfer electrodes on a substrate having a plurality of light-sensing portions through a gate insulating layer so that the light-sensing portions are exposed;
   after the first step, a second step of forming a planarized insulating layer on the substrate to cover the transfer electrodes formed on the substrate;
   after the second step, a third step of forming openings in the planarized insulating layer so that each of the transfer electrodes has a part thereof exposed out of the planarized insulating layer at a predetermined position;
   after the third step, a fourth step of forming wiring grooves in the insulating layer in a predetermined area covering the openings above the transfer electrodes;
   after the fourth step, a fifth step of forming a wiring material layer so that the openings and the wiring grooves are filled with the wiring material layer; and after the fifth step, a sixth step of removing the wiring material layer until the insulating layer is exposed to form connection wirings which are connected to the transfer electrodes by the openings.

3. The method for producing a solid-state imaging device according to claim 1, wherein the planarized insulating layer is formed by forming an insulating layer through an "other insulating layer" and planarizing the insulating layer by a CMP (chemical mechanical polishing) method using the "other insulating layer" as a stopper.

4. The method for producing a solid-state imaging device according to claim 2, wherein the planarized insulating layer is formed by forming an insulating layer through an "other insulating layer" and planarizing the insulating layer by a CMP (chemical mechanical polishing) method using the "other insulating layer" as a stopper.

5. The method for producing a solid-state imaging device according to claim 3, further comprising a step of: forming another insulating layer after the step of planarizing the insulating layer.

6. The method for producing a solid-state imaging device according to claim 1, further comprising steps of:
forming, after the connection wirings are formed, an insulating layer to cover the connection wirings by means of forming an insulating layer and a resist layer in a planarized manner on the entire surface of the substrate to cover the connection wirings and then exposing and developing the resist layer to pattern the insulating layer; and
forming a light shielding layer in the area excluding the light-sensing portions.

7. The method for producing a solid-state imaging device according to claim 2, further comprising steps of:
forming, after the connection wirings are formed, an insulating layer to cover the connection wirings by means of forming an insulating layer and a resist layer in a planarized manner on the entire surface of the substrate to cover the connection wirings and then exposing and developing the resist layer to pattern the insulating layer; and
forming a light shielding layer in the area excluding the light-sensing portions.

8. The method for producing a solid-state imaging device according to claim 1, further comprising steps of:
forming, after the connection wirings are formed, an insulating layer to cover the connection wirings; and
forming a light shielding layer on the insulating layer in the area excluding the light-sensing portions.

9. The method for producing a solid-state imaging device according to claim 2, further comprising steps of:
forming, after the connection wirings are formed, an insulating layer to cover the connection wirings; and
forming a light shielding layer on the insulating layer in the area excluding the light-sensing portions.

10. A method for producing an electronic device, comprising steps of:
a first step of forming transfer electrodes on a substrate having a plurality of light-sensing portions through a gate insulating layer so that the light-sensing portions are exposed;
after the first step, a second step of forming a planarized insulating layer on the substrate to cover the transfer electrodes formed on the substrate;
after the second step, a third step of forming openings in the planarized insulating layer so that each of the transfer electrodes has a part thereof exposed out of the planarized insulating layer at a predetermined position;
after the third step, a fourth step of forming a wiring material layer so that the openings are filled with the wiring material layer;
after the fourth step, a fifth step of forming a resist layer on the wiring material layer;
after the fifth step, a sixth step of exposing and developing the resist layer so that only the resist layer in a predetermined area covering the openings is left; and
after the sixth step, a seventh step of patterning the wiring material layer using the exposed and developed resist layer to form connection wirings which are connected to the transfer electrodes by the openings.

* * * * *